(12) United States Patent
Wang et al.

(10) Patent No.: US 8,315,083 B2
(45) Date of Patent: Nov. 20, 2012

(54) TECHNIQUES FOR REDUCING A VOLTAGE SWING

(75) Inventors: Ping Wang, Cupertino, CA (US); Eric Carman, Cernex (FR)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 13/092,673

(22) Filed: Apr. 22, 2011

(65) Prior Publication Data
US 2011/0228617 A1     Sep. 22, 2011

Related U.S. Application Data

(63) Continuation of application No. 12/244,183, filed on Oct. 2, 2008, now Pat. No. 7,933,140.

(51) Int. Cl.
*G11C 11/24* (2006.01)
(52) U.S. Cl. ....................................................... 365/149
(58) Field of Classification Search .................. 365/149, 365/177
See application file for complete search history.

(56) References Cited

U.S. PATENT DOCUMENTS

| | | |
|---|---|---|
| 3,439,214 A | 4/1969 | Kabell |
| 3,997,799 A | 12/1976 | Baker |
| 4,032,947 A | 6/1977 | Kesel et al. |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,658,377 A | 4/1987 | McElroy |
| 4,791,610 A | 12/1988 | Takemae |
| 4,807,195 A | 2/1989 | Busch et al. |

(Continued)

FOREIGN PATENT DOCUMENTS
CA           272437           7/1927
(Continued)

OTHER PUBLICATIONS

Arimoto et al., A Configurable Enhanced T2RAM Macro for System-Level Power Management Unified Memory, 2006, VLSI Symposium.

(Continued)

*Primary Examiner* — Anh Phung
(74) *Attorney, Agent, or Firm* — Wilmer Cutler Pickering Hale and Dorr LLP

(57) ABSTRACT

Techniques for reducing a voltage swing are disclosed. In one particular exemplary embodiment, the techniques may be realized as an apparatus for reducing a voltage swing comprising: a plurality of dynamic random access memory cells arranged in arrays of rows and columns, each dynamic random access memory cell including one or more memory transistors. The one or more memory transistors of the apparatus for reducing a voltage swing may comprise: a first region coupled to a source line, a second region coupled to a bit line, a first body region disposed between the first region and the second region, wherein the first body region may be electrically floating, and a first gate coupled to a word line spaced apart from, and capacitively coupled to, the first body region. The apparatus for reducing a voltage swing may also comprise a first voltage supply coupled to the source line configured to supply a first voltage and a second voltage to the source line, wherein a difference between the first voltage and the second voltage may be less than 3.5V.

21 Claims, 15 Drawing Sheets

U.S. PATENT DOCUMENTS

| | | |
|---|---|---|
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa |
| 5,355,330 A | 10/1994 | Hisamoto et al. |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidada et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes |
| 6,538,916 B2 | 3/2003 | Ohsawa |
| 6,544,837 B1 | 4/2003 | Divakauni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B2 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portman et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 | 6/2007 | Keshavarzi |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller |

| | | |
|---|---|---|
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0084247 A1 | 4/2006 | Liu |
| 2006/0091462 A1 | 5/2006 | Okhonin et al. |
| 2006/0098481 A1 | 5/2006 | Okhonin et al. |

| | | | |
|---|---|---|---|
| 2006/0126374 A1 | | 6/2006 | Waller et al. |
| 2006/0131650 A1 | | 6/2006 | Okhonin et al. |
| 2006/0223302 A1 | | 10/2006 | Chang et al. |
| 2007/0008811 A1 | | 1/2007 | Keeth et al. |
| 2007/0023833 A1 | | 2/2007 | Okhonin et al. |
| 2007/0045709 A1 | | 3/2007 | Yang |
| 2007/0058427 A1 | | 3/2007 | Okhonin et al. |
| 2007/0064489 A1 | | 3/2007 | Bauser |
| 2007/0085140 A1 | | 4/2007 | Bassin |
| 2007/0097751 A1 | | 5/2007 | Popoff et al. |
| 2007/0114599 A1 | | 5/2007 | Hshieh |
| 2007/0133330 A1 | | 6/2007 | Ohsawa |
| 2007/0138524 A1 | | 6/2007 | Kim et al. |
| 2007/0138530 A1 | | 6/2007 | Okhonin et al. |
| 2007/0187751 A1 | | 8/2007 | Hu et al. |
| 2007/0187775 A1 | | 8/2007 | Okhonin et al. |
| 2007/0200176 A1 | | 8/2007 | Kammler et al. |
| 2007/0252205 A1 | | 11/2007 | Hoentschel et al. |
| 2007/0263466 A1 | | 11/2007 | Morishita et al. |
| 2007/0278578 A1 | | 12/2007 | Yoshida et al. |
| 2008/0049486 A1 | | 2/2008 | Gruening-von Schwerin |
| 2008/0083949 A1 | | 4/2008 | Zhu et al. |
| 2008/0099808 A1 | | 5/2008 | Burnett et al. |
| 2008/0130379 A1 | | 6/2008 | Ohsawa |
| 2008/0133849 A1 | | 6/2008 | Demi et al. |
| 2008/0165577 A1 | | 7/2008 | Fazan et al. |
| 2008/0253179 A1 | | 10/2008 | Slesazeck |
| 2008/0258206 A1 | | 10/2008 | Hofmann |
| 2009/0086535 A1 | | 4/2009 | Ferrant et al. |
| 2009/0121269 A1 | | 5/2009 | Caillat et al. |
| 2009/0127592 A1 | | 5/2009 | El-Kareh et al. |
| 2009/0201723 A1 | | 8/2009 | Okhonin et al. |
| 2010/0085813 A1 | | 4/2010 | Shino |
| 2010/0091586 A1 | | 4/2010 | Carman |
| 2010/0110816 A1 | | 5/2010 | Nautiyal et al. |
| 2010/0296327 A1* | | 11/2010 | Banna et al. ................ 365/72 |

FOREIGN PATENT DOCUMENTS

| | | |
|---|---|---|
| EP | 0 030 856 | 6/1981 |
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |

| | | |
|---|---|---|
| EP | 0 689 252 | 8/2000 |
| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | WO 01/24268 | 4/2001 |
| WO | WO 2005/008778 | 1/2005 |

OTHER PUBLICATIONS

Arimoto, A High-Density Scalable Twin Transistor RAM (TTRAM) With Verify Control for SOI Platform Memory IPs, Nov. 2007, Solid-State Circuits.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, pp. 809-812.

Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.

Assaderaghi et al., "A Novel Silicon-On-Insulator (SOI) MOSFET for Ultra Low Voltage Operation", 1994 IEEE Symposium on Low Power Electronics, pp. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.

Avci, Floating Body Cell (FBC) Memory for 16-nm Technology with Low Variation on Thin Silicon and 10-nm BOX, Oct. 2008, SOI Conference.

Bae, Evaluation of 1T RAM using Various Operation Methods with SOONO (Silicon-On-ONO) device, Dec. 2008, IEDM.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

Ban, A Scaled Floating Body Cell (FBC) Memory with High-k+Metal Gate on Thin-Silicon and Thin-BOX for 16-nm Technology Node and Beyond, Jun. 2008, VLSI Symposium.

Ban, Ibrahim, et al., "Floating Body Cell with Independently-Controlled Double Gates for High Density Memory," Electron Devices Meeting, 2006. IEDM '06, International, IEEE, Dec. 11-13, 2006.

Bawedin, Maryline, et al., A Capacitorless 1T DRAM on SOI Based on Dynamic Coupling and Double-Gate Operation, IEEE Electron Device Letters, vol. 29, No. 7, Jul. 2008.

Blagojevic et al., Capacitorless 1T DRAM Sensing Scheme Automatice Reference Generation, 2006, IEEE J.Solid State Circuits.

Blalock, T., "A High-Speed Clamped Bit-Line Current-Mode Sense Amplifier", IEEE Journal of Solid-State Circuits, vol. 26, No. 4, Apr. 1991, pp. 542-548.

Butt, Scaling Limits of Double Gate and Surround Gate Z-RAM Cells, 2007, IEEE Trans. on El. Dev.

Chan et al., "Effects of Floating Body on Double Polysilicon Partially Depleted SOI Nonvolatile Memory Cell", IEEE Electron Device Letters, vol. 24, No. 2, Feb. 2003, pp. 75-77.

Chan, et al., "SOI MOSFET Design for All-Dimensional Scaling with Short Channel, Narrow Width and Ultra-thin Films", IEEE IEDM, 1995, pp. 631-634.

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.

Cho et al., "Novel DRAM Cell with Amplified Capacitor for Embedded Application", IEEE, Jun. 2009.

Cho, A novel capacitor-less DRAM cell using Thin Capacitively-Coupled Thyristor (TCCT), 2005, IEDM.

Choi et al., Current Flow Mechanism in Schottky-Barrier MOSFET and Application to the 1T-DRAM, 2008, SSDM.

Choi, High Speed Flash Memory and 1T-DRAM on Dopant Segregated Schottky Barrier (DSSB) FinFET SONOS Device for Multi-functional SoC Applications, Dec. 2008, IEDM.

Clarke, Junctionless Transistors Could Simply Chip Making, Say Researchers, EE Times, Feb. 2010, www.eetimes.com/showArticle.jhtml?articleID=223100050.

Colinge, J.P., "An SOI voltage-controlled bipolar-MOS device", IEEE Transactions on Electron Devices, vol. ED-34, No. 4, Apr. 1987, pp. 845-849.

Colinge, Nanowire Transistors Without Junctions, Nature NanoTechnology, vol. 5, 2010, pp. 225-229.

Collaert et al., Optimizing the Readout Bias for the Capacitorless 1T Bulk FinFET RAM Cell, 2009, IEEE EDL.

Collaert, Comparison of scaled floating body RAM architectures, Oct. 2008, SOI Conference.

Ershov, Optimization of Substrate Doping for Back-Gate Control in SOI T-RAM Memory Technology, 2005, SOI Conference.

Ertosun et al., A Highly Scalable Capacitorless Double Gate Quantum Well Single Transistor DRAM: 1T-QW DRAM, 2008, IEEE EDL.

Fazan et al., "A Simple 1-Transistor Capacitor-Less Memory Cell for High Performance Embedded DRAMs", IEEE 2002 Custom Integrated Circuits Conference, Jun. 2002, pp. 99-102.

Fazan, A Highly Manufacturable Capacitor-less 1T-DRAM Concept, 2002, SPIE.
Fazan, et al., "Capacitor-Less 1-Transistor DRAM", 2002 IEEE International SOI Conference, Oct. 2002, pp. 10-13.
Fazan, P., "MOSFET Design Simplifies DRAM", EE Times, May 14, 2002 (3 pages).
Fisch, Beffa, Bassin, Soft Error Performance of Z-RAM Floating Body Memory, 2006, SOI Conference.
Fisch, Carman, Customizing SOI Floating Body Memory Architecture for System Performance and Lower Cost, 2006, SAME.
Fisch, Z-RAM® Ultra-Dense Memory for 90nm and Below, 2006, Hot Chips.
Fossum et al., New Insights on Capacitorless Floating Body DRAM Cells, 2007, IEEE EDL.
Fujita, Array Architecture of Floating Body Cell (FBC) with Quasi-Shielded Open Bit Line Scheme for sub-40nm Node, 2008, SOI Conference.
Furuhashi, Scaling Scenario of Floating Body Cell (FBC) Suppressing Vth Variation Due to Random Dopant Fluctuation, Dec. 2008, SOI Conference.
Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.
Giffard et al., "Dynamic Effects in SOI MOSFET's", IEEE, 1991, pp. 160-161.
Gupta et al., SPICE Modeling of Self Sustained Operation (SSO) to Program Sub-90nm Floating Body Cells, Oct. 2009, Conf on Simulation of Semiconductor Processes & Devices.
Han et al., Bulk FinFET Unified-RAM (URAM) Cell for Multifunctioning NVM and Capacitorless 1T-DRAM, 2008, IEEE EDL.
Han et al., Partially Depleted SONOS FinFET for Unified RAM (URAM) Unified Function for High-Speed 1T DRAM and Nonvolatile Memory, 2008, IEEE EDL.
Han, Energy Band Engineered Unified-RAM (URAM) for Multi-Functioning 1T-DRAM and NVM, Dec. 2008, IEDM.
Han, Parasitic BJT Read Method for High-Performance Capacitorless 1T-DRAM Mode in Unified RAM, Oct. 2009, IEEE EDL.
Hara, Y., "Toshiba's DRAM Cell Piggybacks on SOI Wafer", EE Times, Jun. 2003.
Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.
Idei et al., "Soft-Error Characteristics in Bipolar Memory Cells with Small Critical Charge", IEEE Transactions on Electron Devices, vol. 38, No. 11, Nov. 1991, pp. 2465-2471.
Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.
Inoh et al., "FBC (Floating Body Cell) for Embedded DRAM on SOI", 2003 Symposium on VLSI Circuits Digest of Technical Papers, Jun. 2003 (2 pages).
Iyer et al., "SOI MOSFET on Low Cost SPIMOX Substrate", IEEE IEDM, Sep. 1998, pp. 1001-1004.
Jang et al., Highly scalable Z-RAM with remarkably long data retention for DRAM application, Jun. 2009, VLSI.
Jeong et al., "A Capacitor-less 1T DRAM Cell Based on a Surrounding Gate MOSFET with Vertical Channel", Technology Development Team, Technology Development Team, Samsung Electronics Co., Ltd., May 2007.
Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.
Jeong et al., "Capacitorless DRAM Cell with Highly Scalable Surrounding Gate Structure", Extended Abstracts of the 2006 International Conference on Solid State Devices and Materials, pp. 574-575, Yokohama (2006).
Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).

Kedzierski, J.; "Design Analysis of Thin-Body Silicide Source/Drain Devices", 2001 IEEE International SOI Conference, Oct. 2001, pp. 21-22.
Kim et al., "Chip Level Reliability on SOI Embedded Memory", Proceedings 1998 IEEE International SOI Conference, Oct. 1998, pp. 135-139.
Kuo et al., "A Capacitorless Double-Gate DRAM Cell Design for High Density Applications", IEEE IEDM, Feb. 2002, pp. 843-846.
Kuo et al., "A Capacitorless Double-Gate DRAM Cell", IEEE Electron Device Letters, vol. 23, No. 6, Jun. 2002, pp. 345-347.
Kuo et al., A Capacitorless Double Gate DRAM Technology for Sub 100 nm Embedded and Stand Alone Memory Applications, 2003, IEEE Trans. on El. Dev.
Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).
Lee et al., "A Novel Pattern Transfer Process for Bonded SOI Gigabit DRAMs", Proceedings 1996 IEEE International SOI Conference, Oct. 1996, pp. 114-115.
Leiss et al., dRAM Design Using the Taper-Isolated Dynamic RAM Cell, IEEE Transactions on Electron Devices, vol. ED-29, No. 4, Apr. 1982, pp. 707-714.
Lin et al., "Opposite Side Floating Gate SOI FLASH Memory Cell", IEEE, Mar. 2000, pp. 12-15.
Liu et al., Surface Generation-Recombination Processes of Gate and STI Oxide Interfaces Responsible for Junction Leakage on SOI, Sep. 2009, ECS Transactions, vol. 25.
Liu, Surface Recombination-Generation Processes of Gate, STI and Buried Oxide Interfaces, Responsible for Junction Leakage, ICSI, May 19, 2009.
Lončar et al., "One of Application of SOI Memory Cell—Memory Array", IEEE Proc. 22nd International Conference on Microelectronics (MIEL 2000), vol. 2, NIS, Serbia, May 14-17, 2000, pp. 455-458.
Lu et al., A Novel Two-Transistor Floating Body/Gate Cell for Low Power Nanoscale Embedded DRAM, 2008, IEEE Trans. on El. Dev.
Ma, et al., "Hot-Carrier Effects in Thin-Film Fully Depleted SOI MOSFET's", IEEE Electron Device Letters, vol. 15, No. 6, Jun. 1994, pp. 218-220.
Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.
Malinge, An 8Mbit DRAM Design Using a 1TBulk Cell, 2005, VLSI Circuits.
Mandelman et al, "Floating-Body Concerns for SOI Dynamic Random Access Memory (DRAM)", Proceedings 1996 IEEE International SOI Conference, Oct. 1996, pp. 136-137.
Matsuoka et al., FBC Potential of 6F2 Single Cell Operation in Multi Gbit Memories Confirmed by a Newly Developed Method for Measuring Signal Sense Margin, 2007, IEDM.
Minami, A Floating Body Cell (FBC) fully Compatible with 90nm CMOS Technology (CMOS IV) for 128Mb SOI DRAM, 2005, IEDM.
Mohapatra et al., Effect of Source/Drain Asymmetry on the Performance of Z-RAMO Devices, Oct. 2009, SOI conference.
Morishita, A Capacitorless Twin-Transistor Random Access Memory (TTRAM) on SOI, 2005, CICC.
Morishita, F. et al., "A Configurable Enhanced TTRAM Macro for System-Level Power Management Unified Memory", IEEE Journal of Solid-State Circuits, vol. 42, No. 4, pp. 853, Apr. 2007.
Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.
Morishita, F., et al., "Dynamic floating body control SOI CMOS for power managed multimedia ULSIs", Proc. CICC, pp. 263-266, 1997.
Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.

Nagoga, Studying of Hot Carrier Effect in Floating Body Soi Mosfets by the Transient Charge Pumping Technique, Switzerland 2003.
Nayfeh, A Leakage Current Model for SOI based Floating Body Memory that Includes the Poole-Frenkel Effect, 2008, SOI Conference.
Nemati, A Novel High Density, Low Voltage SRAM Cell with a Vertical NDR Device, 1998, VLSI Tech. Symp.
Nemati, A Novel Thyristor-based SRAM Cell (T-RAM) for High-Speed, Low-Voltage, Giga-scale Memories, 1999, IEDM Conference.
Nemati, Embedded Volatile Memories—Embedded Tutorial: The New Memory Revolution, New Drives Circuits and Systems, ICCAD 2008, Nov. 2008.
Nemati, Fully Planar 0.562μm2 T-RAM Cell in a 130nm SOI CMOS Logic Technology for High-Density High-Performance SRAMs, 2004, IEDM.
Nemati, The New Memory Revolution. New Devices, Circuits and Systems, 2008, ICCAD.
Nemati, Thyristor RAM (T-RAM): A High-Speed High-Density Embedded Memory Technology for Nano-scale CMOS, 2007, Hot Chips.
Nemati, Thyristor-RAM: A Novel Embedded Memory Technology that Outperforms Embedded S RAM/DRAM, 2008, Linley Tech Tour.
Nishiguchi et al., Long Retention of Gain-Cell Dynamic Random Access Memory with Undoped Memory Node, 2007, IEEE EDL.
Oh, Floating Body DRAM Characteristics of Silicon-On-ONO (SOONO) Devices for System-on-Chip (SoC) Applications, 2007, VLSI Symposium.
Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.
Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).
Ohsawa et al., "Memory Design Using a One-Transistor Gain Cell on SOI", IEEE Journal of Solid-State Circuits, vol. 37, No. 11, Nov. 2002, pp. 1510-1522.
Ohsawa, A 128Mb Floating Body RAM (FBRAM) on SOI with a Multi-Averaging Scheme of Dummy Cell, 2006 Symposium of VLSI Circuits Digest of Tech Papers, (2006).
Ohsawa, An 18.5ns 128Mb SOI DRAM with a Floating Body Cell, 2005, ISSCC.
Ohsawa, Autonomous Refresh of Floating Body Cell (FBC), Dec. 2008, IEDM.
Ohsawa, Design of a 128-Mb SOI DRAM Using the Floating Body Cell (FBC), Jan. 2006, Solid-State Circuits.
Okhonin, A Capacitor-Less 1T-DRAM Cell, Feb. 2002, Electron Device Letters.
Okhonin, A SOI Capacitor-less 1T-DRAM Concept, 2001, SOI Conference.
Okhonin, Charge Pumping Effects in Partially Depleted SOI MOSFETs, 2003, SOI Conference.
Okhonin, New characterization techniques for SOI and related devices, 2003, ECCTD.
Okhonin, New Generation of Z-RAM, 2007, IEDM.
Okhonin, Principles of Transient Charge Pumping on Partially Depleted SOI MOSFETs, May 2002, Electron Device Letters.
Okhonin, Transient Charge Pumping for Partially and Fully Depleted SOI MOSFETs, 2002, SOI Conference.
Okhonin, Transient effects in PD SOI MOSFETs and potential DRAM applications, 2002, Solid-State Electronics.
Okhonin, Ultra-scaled Z-RAM cell, 2008, SOI Conference.
Okhonin, Z-RAM® (Limits of DRAM), 2009, ESSDERC.
Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.
Park, Fully Depleted Double-Gate 1T-DRAM Cell with NVM Function for High Performance and High Density Embedded DRAM, 2009, IMW.

Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.
Portmann et al., "A SOI Current Memory for Analog Signal Processing at High Temperature", 1999 IEEE International SOI Conference, Oct. 1999, pp. 18-19.
Puget et al., 1T Bulk eDRAM using GIDL Current for High Speed and Low Power applications, 2008, SSDM.
Puget et al., Quantum effects influence on thin silicon film capacitor-less DRAM performance, 2006, SOI Conference.
Puget, FDSOI Floating Body Cell eDRAM Using Gate-Induced Drain-Leakage (GIDL) Write Current for High Speed and Low Power Applications, 2009, IMW.
Ranica et al., 1T-Bulk DRAM cell with improved performances: the way to scaling, 2005, ICMTD.
Ranica, A capacitor-less DRAM cell on 75nm gate length, 16nm thin Fully Depleted SOI device for high density embedded memories, 2004, IEDM.
Ranica, A One Transistor Cell on Bulk Substrate (1T-Bulk) for Low-Cost and High Density eDRAM, 2004, VLSI Symposium.
Rodder et al., "Silicon-On-Insulator Bipolar Transistors", IEEE Electron Device Letters, vol. EDL-4, No. 6, Jun. 1983, pp. 193-195.
Rodriguez, Noel, et al., A-RAM Novel Capacitor-less Dram Memory, SOI Conference, 2009 IEEE International, Oct. 5-8, 2009 pp. 1-2.
Roy, Thyristor-Based Volatile Memory in Nano-Scale CMOS, 2006, ISSCC.
Salling et al., Reliability of Thyristor Based Memory Cells, 2009, IRPS.
Sasaki et al., Charge Pumping in SOS-MOS Transistors, 1981, IEEE Trans. on El. Dev.
Sasaki et al., Charge Pumping SOS-MOS Transistor Memory, 1978, IEDM.
Schloesser et al., "A 6F2 Buried Wordline DRAM Cell for 40nm and Beyond", IEEE, Qimonda Dresden GmbH & Co., pp. 809-812 (2008).
Shino et al., Floating Body RAM technology and its scalability to 32 nm node and beyond, 2006, IEDM.
Shino et al., Operation Voltage Dependence of Memory Cell Characteristics in Fully Depleted FBC, 2005, IEEE Trans. on El. Dev.
Shino, Fully-Depleted FBC (Floating Body Cell) with Enlarged Signal Window and Excellent Logic Process Compatibility, 2004, IEDM.
Shino, Highly Scalable FBC (Floating Body Cell) with 25nm BOX Structure for Embedded DRAM Applications, 2004, VLSI Symposium.
Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.
Singh, A 2ns-Read-Latency 4Mb Embedded Floating-Body Memory Macro in 45nm SOI Technology, Feb. 2009, ISSCC.
Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.
Song, 55 nm Capacitor-less 1T DRAM Cell Transistor with Non-Overlap Structure, Dec. 2008, IEDM.
Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.
Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).
Suma et al., "An SOI-DRAM with Wide Operating Voltage Range by CMOS/SIMOX Technology", 1994 IEEE International Solid-State Circuits Conference, pp. 138-139.
Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al, "An Analytical Model for the Misis Structure in SOI MOS Devices", Solid-State Electronics vol. 33, No. 3, 1990, pp. 357-364.

Tanabe et al., A 30-ns 64-MB DRAM with Built-in-Self-Test and Self-Repair Function, IEEE Journal of Solid State Circuits, vol. 27, No. 11, Nov. 1992, pp. 1525-1533.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15 μm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. on El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DD-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. on El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

* cited by examiner

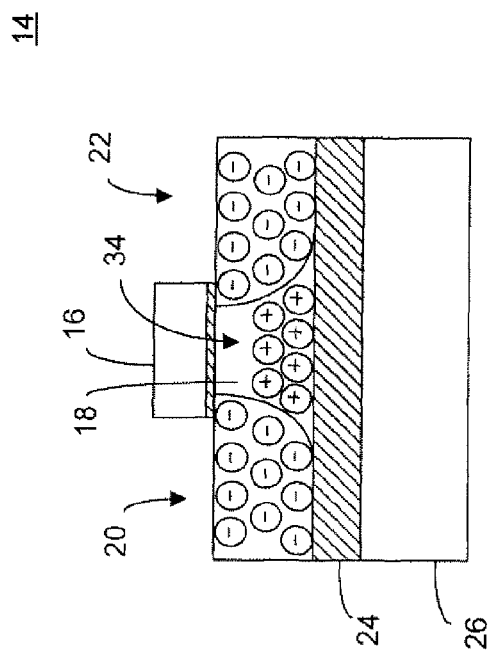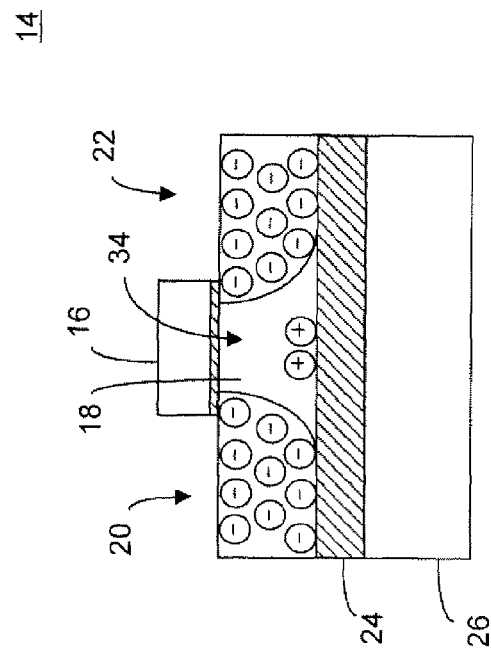

TECHNIQUES FOR REDUCING A VOLTAGE SWING

CROSS-REFERENCE TO RELATED APPLICATIONS

This patent application is a continuation of U.S. patent application Ser. No. 12/244,183, filed Oct. 2, 2008, now U.S. Pat. No. 7,933,140, issued Apr. 26, 2011, which is hereby incorporated by reference herein in its entirety.

FIELD OF THE DISCLOSURE

The present disclosure relates generally to semiconductor dynamic random access memory ("DRAM") devices and, more particularly, to techniques for reducing a voltage swing in a semiconductor dynamic random access memory ("DRAM") device.

BACKGROUND OF THE DISCLOSURE

There is a continuing trend to employ and/or fabricate advanced integrated circuits using techniques, materials, and devices that improve performance, reduce leakage current, and enhance overall scaling. Semiconductor-on-insulator (SOI) is a material which may be used to fabricate such integrated circuits. Such integrated circuits are known as SOI devices and may include, for example, partially depleted (PD) devices, fully depleted (FD) devices, multiple gate devices (for example, double or triple gate), and Fin-FET devices.

A semiconductor dynamic random access memory ("DRAM") device may include an electrically floating body in which electrical charges may be stored. The electrical charges stored in the electrically floating body may represent a logic high or binary "1" data state or a logic low or binary "0" data state.

In one conventional technique, a memory cell having one or more memory transistors may be read by applying a bias to a drain region of a memory transistor, as well as a bias to a gate of the memory transistor that is above a threshold voltage of the memory transistor. As such, conventional reading techniques sense an amount of channel current provided/generated in response to the application of the bias to the gate of the memory transistor to determine a state of the memory cell. For example, an electrically floating body region of the memory cell may have two or more different current states corresponding to two or more different logical states (e.g., two different current conditions/states corresponding to two different logics: binary "0" data state and binary "1" data state).

Also, conventional writing techniques for memory cells having an N-Channel type memory transistor typically result in an excess of majority charge carriers by channel impact ionization or by band-to-band tunneling (gate-induced drain leakage "GIDL"). The majority charge carriers may be removed via drain side hole removal, source side hole removal, or drain and source hole removal, for example, using back gate pulsing.

Often, conventional reading and writing techniques may lead to relatively large power consumption and large voltage swings which may cause disruptions to memory cells on unselected rows. Also, pulsing between positive and negative gate biases during read and write operations may reduce a net quantity of charge carriers in a body region of a memory cell in a semiconductor DRAM device, which, in turn, may gradually eliminate data stored in the memory cell. In the event that a negative voltage is applied to a gate of a memory cell transistor, thereby causing a negative gate bias, channel of minority charge carriers beneath the gate may be eliminated. However, some of the minority charge carriers may remain "trapped" in interface defects. Some of the trapped minority charge carriers may recombine with majority charge carriers, which may be attracted to the gate, and the net charge in majority charge carriers located in the floating body region may decrease over time. This phenomenon may be characterized as charge pumping, which is a problem because the net quantity of charge carriers may be reduced in the memory cell, which, in turn, may gradually eliminate data stored in the memory cell.

In view of the foregoing, it may be understood that there are significant problems and shortcomings associated with reading from and/or writing to semiconductor dynamic random access memory ("DRAM") devices using conventional current sensing technologies.

SUMMARY OF THE DISCLOSURE

Techniques for reducing a voltage swing are disclosed. In one particular exemplary embodiment, the techniques may be realized as an apparatus for reducing a voltage swing comprising: a plurality of dynamic random access memory cells arranged in arrays of rows and columns, each dynamic random access memory cell including one or more memory transistors. The one or more memory transistors of the apparatus for reducing a voltage swing may comprise: a first region coupled to a source line, a second region coupled to a bit line, a first body region disposed between the first region and the second region, wherein the first body region may be electrically floating, and a first gate coupled to a word line spaced apart from, and capacitively coupled to, the first body region. The apparatus for reducing a voltage swing may also comprise a first voltage supply coupled to the source line configured to supply a first voltage and a second voltage to the source line, wherein a difference between the first voltage and the second voltage may be less than 3.5V.

In accordance with other aspects of this particular exemplary embodiment, the first voltage may be supplied during a holding operation.

In accordance with further aspects of this particular exemplary embodiment, the second voltage may be supplied during at least one of a writing operation and a reading operation.

In accordance with additional aspects of this particular exemplary embodiment, the first voltage may be approximately in a range of 0.5V to 1.5V.

In accordance with yet another aspect of this particular exemplary embodiment, the second voltage may be approximately in a range of 2.5V to 3.5V.

In accordance with still another aspect of this particular exemplary embodiment, the difference between the first voltage and the second voltage may be less than 2V.

In accordance with further aspects of this particular exemplary embodiment, the apparatus for reducing a voltage swing may further comprise a second voltage supply coupled to the bit line configured to supply a third voltage and a fourth voltage to the bit line.

In accordance with additional aspects of this particular exemplary embodiment, the third voltage may be supplied during a holding operation.

In accordance with another aspect of this particular exemplary embodiment, the fourth voltage may be supplied during at least one of a writing operation and a reading operation.

In accordance with other aspects of this particular exemplary embodiment, the third voltage may be approximately the same as the first voltage.

In accordance with further aspects of this particular embodiment, the fourth voltage may be approximately in a range of 0V to 0.5V.

In accordance with additional aspects of this particular exemplary embodiment, the apparatus for reducing a voltage swing may further comprise a third voltage supply coupled to the word line configured to supply a fifth voltage and a sixth voltage to the word line.

In accordance with yet another aspect of this particular exemplary embodiment, the fifth voltage may be supplied during a holding operation.

In accordance with other aspects of this particular exemplary embodiment, the sixth voltage may be supplied during at least one of a writing operation and a reading operation.

In accordance with further aspects of this particular embodiment, the fifth voltage may be approximately −1.2V.

In accordance with additional aspects of this particular exemplary embodiment, the sixth voltage may be approximately in a range of 0.5V to −0.5V.

In another particular exemplary embodiment, the techniques may be realized as a method for reducing a voltage swing comprising the steps of: arranging a plurality of dynamic random access memory cells in arrays of rows and columns, each dynamic random access memory cell including one or more memory transistors. The one or more memory transistors of the method for reducing a voltage swing may comprise: a first region coupled to a source line, a second region coupled to a bit line, a first body region disposed between the first region and the second region, wherein the first body region may be electrically floating and charged to a first predetermined voltage potential, and a first gate coupled to a word line spaced apart from, and capacitively coupled to, the first body region. The method for reducing a voltage swing may also comprise supplying a first voltage and a second voltage to the source line, wherein a difference between the first voltage and the second voltage may be less than 3.5V.

In accordance with other aspects of this particular exemplary embodiment, supplying a first voltage may be during a holding operation.

In accordance with further aspects of this particular embodiment, supplying a second voltage may be during at least one of a writing operation and a reading operation.

In accordance with additional aspects of this particular exemplary embodiment, the first voltage may be approximately in a range of 0.5V to 1.5V.

In accordance with yet another aspect of this particular exemplary embodiment, the second voltage may be approximately in a range of 2.5V to 3.5V.

In accordance with other aspects of this particular exemplary embodiment, the difference between the first voltage and the second voltage may be less than 2V.

In accordance with further aspects of this particular embodiment, the method for reducing a voltage swing may further comprise supplying a third voltage and a fourth voltage to the bit line.

In accordance with additional aspects of this particular exemplary embodiment, supplying a third voltage may be during a holding operation.

In accordance with yet another aspect of this particular exemplary embodiment, supplying a fourth voltage may be during at least one of a writing operation and a reading operation.

In accordance with other aspects of this particular exemplary embodiment, the third voltage may be approximately same as the first voltage.

In accordance with further aspects of this particular exemplary embodiment, at least one processor readable medium for storing a computer program of instructions configured to be readable by at least one processor for instructing the at least one processor to execute a computer process for performing the method for reducing a voltage swing.

In another particular exemplary embodiment, the techniques for reducing a voltage swing may be realized as an article of manufacture for reducing a voltage swing, the article of manufacture comprising: at least one processor readable medium, and instructions carried on the at least one medium, wherein the instructions are configured to be readable from the at least one medium by at least one processor. The at least one processor to operate so as to: arranging a plurality of dynamic random access memory cells in arrays of rows and columns, each dynamic random access memory cell. The one or more memory transistors may comprise: a first region coupled to a source line, a second region coupled to a bit line, a first body region disposed between the first region and the second region, wherein the first body region may be electrically floating and charged to a first predetermined voltage potential, a first gate coupled to a word line spaced apart from, and capacitively coupled to, the first body region. Also, the at least one processor may operate so as to: supplying a first voltage and a second voltage to the source line, wherein difference between the first voltage and the second voltage may be less than 3.5V.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIGS. 2A and 2B show a schematic charge relationship, for a given data state, of the floating body, source region, and drain regions of a memory cell in accordance with an embodiment of the present disclosure.

DETAILED DESCRIPTION OF EXEMPLARY EMBODIMENTS

There are many embodiments described and illustrated herein. In one aspect, the present disclosure is directed to a combination of reading/writing methods which allows relatively low power consumption and provides a relatively low voltage swing and thus reduces disruptions to unselected memory cells.

Figure 1A:
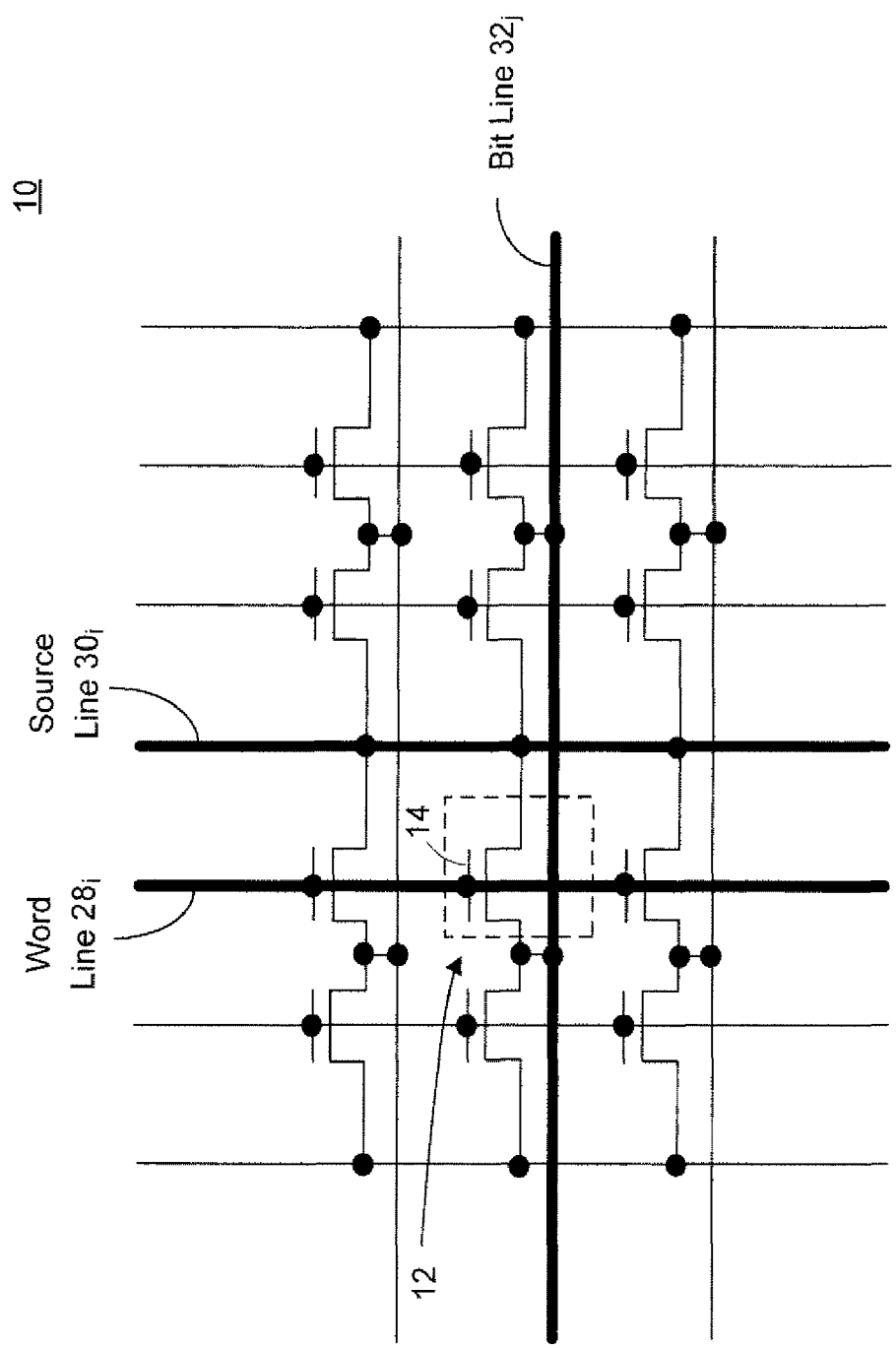
FIG. 1A shows a schematic representation of a semiconductor DRAM array including a plurality of memory cells in accordance with an embodiment of the present disclosure.
Figure 1B:
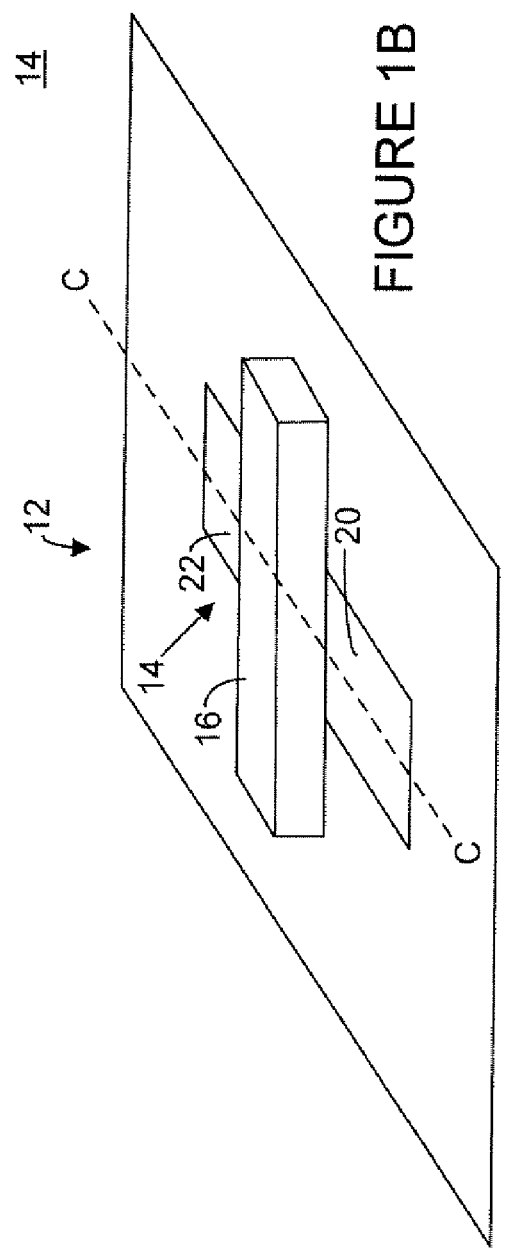
FIG. 1B shows a three-dimensional view of a memory cell in accordance with an embodiment of the present disclosure.
Figure 1C:
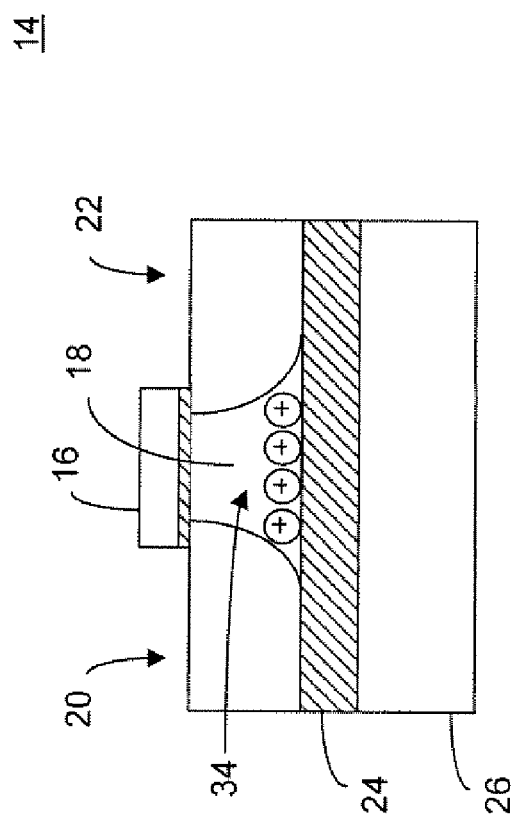
FIG. 1C shows a cross-sectional view along line C-C' of the memory cell of FIG. 1B in accordance with an embodiment of the present disclosure.

Referring to FIGS. 1A, 1B, and 1C, a semiconductor DRAM device 10 (e.g., a logic or discrete memory device) including one or more memory cells 12 including a memory transistor 14 having an electrically floating body (e.g., an N-channel type transistor or a P-channel type transistor). The memory transistor 14 includes a source region 20, a drain region 22, a body region 18 disposed between the source region 20 and the drain region 22, wherein the body region 18 is electrically floating, and a gate 16 disposed over the body region 18. Moreover, the body region 18 may be disposed on or above region 24, which may be an insulation region (e.g., in an SOI material/substrate) or non-conductive region (e.g., in a bulk-type material/substrate). The insulation or non-conductive region 24 may be disposed on substrate 26.

Data may be written into a selected memory cell 12 by applying suitable control signals to a selected word line 28, a selected source line 30, and/or a selected bit line 32. The memory cell 12 may include (1) a first data state which is representative of a first amount of charges in the body region of the memory transistor 14, and (2) a second data state which is representative of a second amount of charges in the body region 18 of the memory transistor 14. The semiconductor DRAM device 10 may further include data write circuitry (not shown), coupled to the memory cell 12, to apply (i) first write control signals to the memory cell 12 to write the first data state therein and (ii) second write control signals to the memory cell 12 to write the second data state therein, wherein, in response to the first write control signals applied to the memory cell 12, the memory transistor 14 may generate a first bipolar transistor current which substantially provides the first charge in the body region 18 of the memory transistor 14. In response, charge carriers are accumulated in or emitted and/or ejected from electrically floating body region 18 wherein data states are defined by the amount of charge carriers accumulated within electrically floating body region 18. The charge carriers accumulated on the electrically floating body 18 may represent a logic high (binary "1" data state) or a logic low or (binary "0" data state).

For example, the first write control signals may include a signal applied to the gate 16 and a signal applied to the source region 20 wherein the signal applied to the source region 20 may include a first voltage potential having a first amplitude and a second voltage potential having a second amplitude. In another exemplary embodiment, the first write control signals may include a signal applied to the gate 16 and a signal applied to the drain region 22 wherein the signal applied to the drain region 22 may include a first voltage potential having a first amplitude and a second voltage potential having a second amplitude.

Also, the second write signals may include a signal applied to the gate 16, a signal applied to the source region 20, and a signal applied to the drain region 22. The signal applied to the drain region 22 may include a block voltage to prevent the first data state from being written into the memory transistor 14.

In an exemplary embodiment, the memory cell 12 of semiconductor DRAM device 10 may operate by accumulating in or emitting/ejecting majority charge carriers 34 (e.g., electrons or holes) from the electrically floating body region 18 (e.g., N-Channel transistor illustrated in FIGS. 2A and 2B). In this regard, various write techniques may be employed to accumulate majority charge carriers 34 (in this example, holes) in electrically floating body 18 of the memory cell 12 by, for example, impact ionization near source region 20 and/or drain region 22 (See, FIG. 2A). The majority charge carriers 34 may be emitted or ejected from the electrically floating body 18 by, for example, forward biasing the source region 20/electrically floating body 18 junction and/or the drain region 22/electrically floating body 18 junction (See, FIG. 2B).

For example, a logic high (binary data state "1") may correspond to, an increased concentration of majority charge carriers in the electrically floating body region 18 relative to an unwritten device and/or a device that is written with a logic low (binary data state "0"). In contrast, a logic low (binary "0" data state) may correspond to, for example, a reduced concentration of majority charge carriers in the electrically floating body region 18 relative to an unwritten device and/or a device that is written with a logic high (binary "1" data state).

The semiconductor DRAM device 10 may further include data sense circuitry (not shown), coupled to the memory cell 12, to sense data state of the memory cell 12. In response to read control signals applied to the memory cell 12, the memory transistor 14 may generate a second bipolar transistor current which is representative of data state of the memory cell 12 and wherein the data sense circuitry may determine data state of the memory cell 12 at least substantially based on the second bipolar transistor current.

The read control signals may include a signal applied to the gate 16, source region 20, and drain region 22 to cause, force and/or induce the bipolar transistor current which is representative of data state of the memory cell 12. The signal applied to the drain region 22 may include a positive voltage or a negative voltage. Indeed, one or more of the read control signals may include a constant or unchanging voltage amplitude.

In addition, the semiconductor DRAM device 10 may include a memory cell 12 array including a plurality of word lines (WL), a plurality of source lines (SL), a plurality of bit lines (BL), and a plurality of memory cells 12 arranged in a matrix of rows and columns. Each memory cell 12 may include a memory transistor 14, wherein the memory transistor 14 may include a source region 20 coupled to an associated source line (SL), a drain region 22, a body region 18 disposed between the source region 20, and the drain region 22 coupled to an associated bit line (BL), wherein the body region 18 is electrically floating, and a gate 16 disposed over the body region 18 and coupled to an associated word line (WL). For example, the source region 20 of the memory transistor 14 of each memory cell 12 of a first row of memory cells may be connected to a first source line (SL). Also, the source region 20 of the memory transistor 14 of each memory cell 12 of a second row of memory cells is connected to the first source line (SL). In another exemplary embodiment, the source region 20 of the memory transistor 14 of each memory cell 12 of a second row of memory cells may be connected to a second source line (SL), and the source region 20 of the memory transistor 14 of each memory cell 12 of a third row of memory cells is connected to a third source line (SL).

Figure 3A:
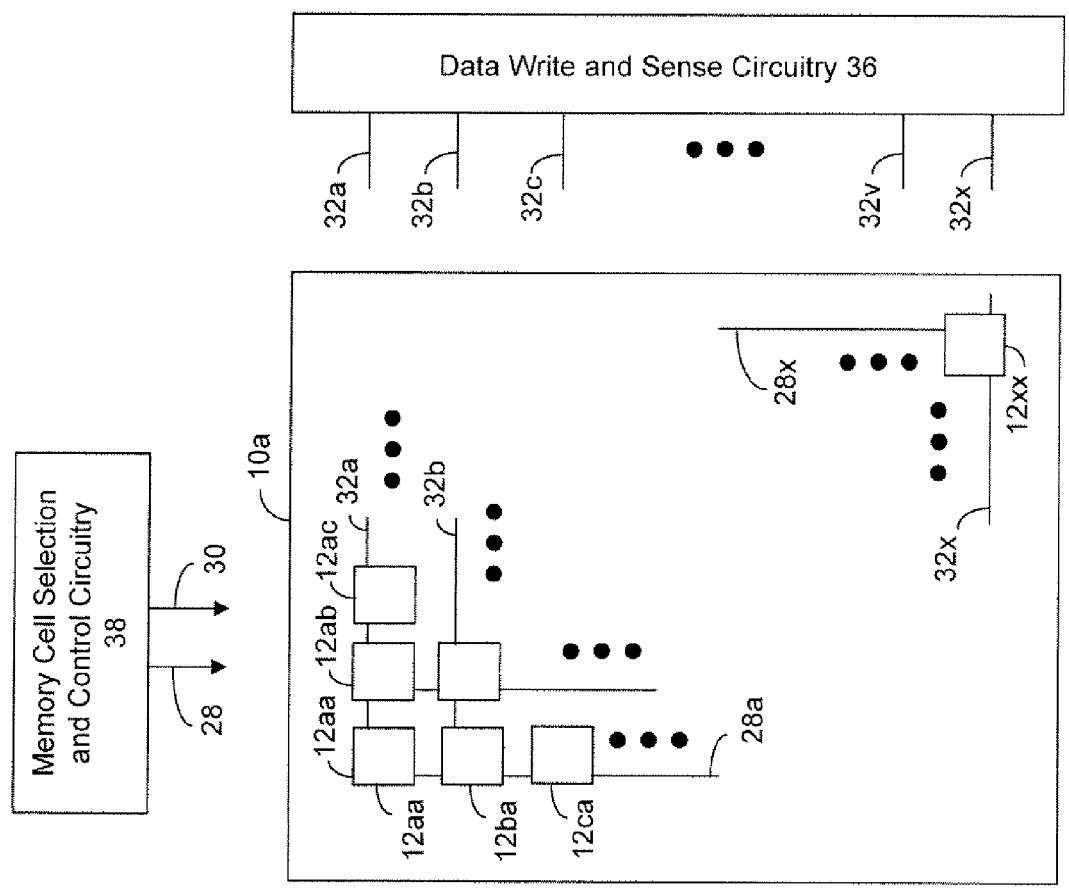
FIGS. 3A and 3B show schematic block diagrams of embodiments of a semiconductor DRAM device including, memory cell arrays, data sense and write circuitry, memory cell selection, and control circuitry in accordance with an embodiment of the present disclosure.
Figure 3B:
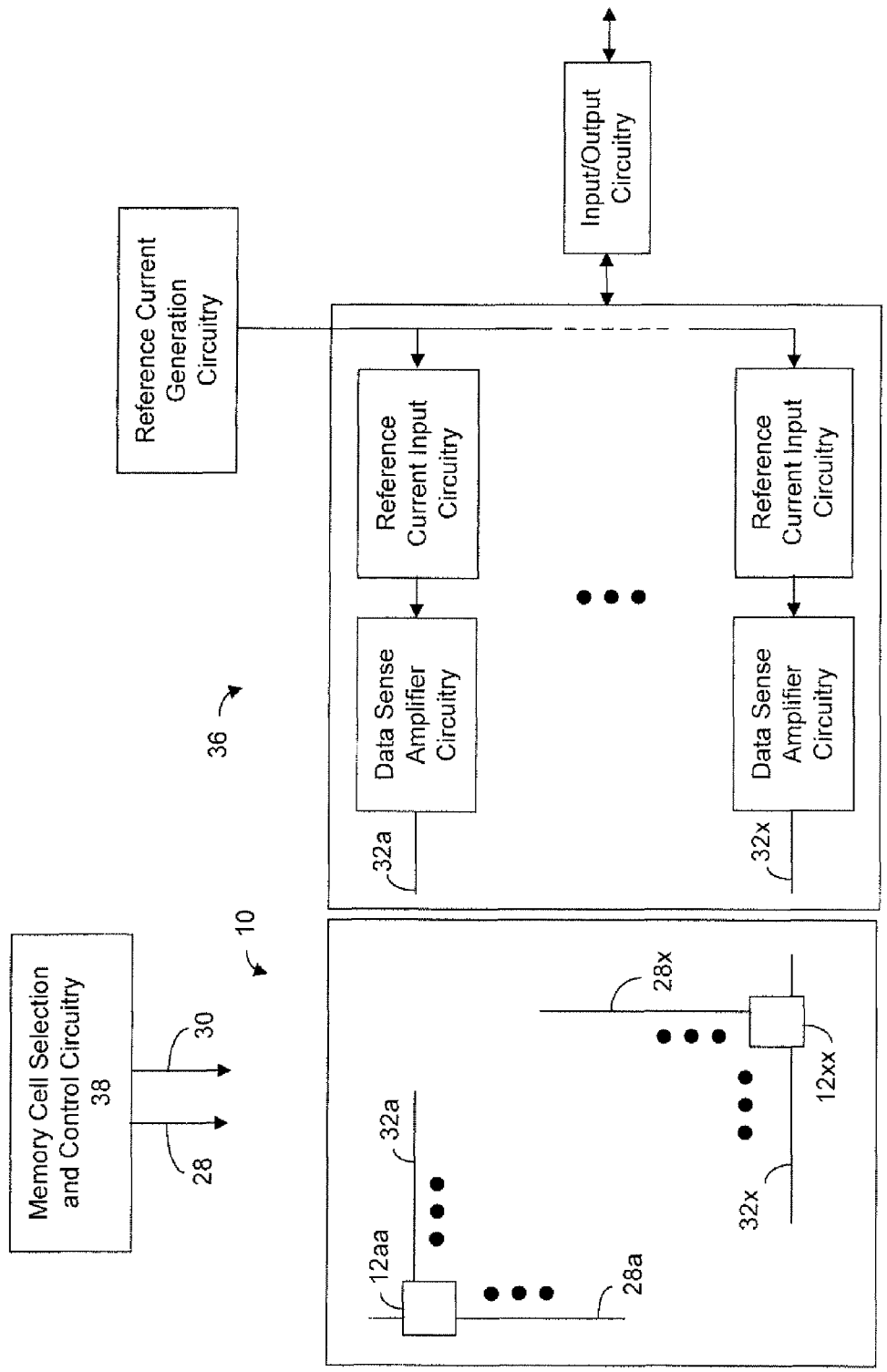

Referring to FIGS. 3A and 3B, show schematic block diagrams of a semiconductor DRAM device including, a memory cell array, data sense and write circuitry, memory cell selection and control circuitry in accordance with an embodiment of the present disclosure. The semiconductor DRAM device 10 may include an array having a plurality of memory cells 12 having a separate source line (SL) for each row of memory cells (a row of memory cells includes a common word line connected to the gates of each memory cell 12 of the row), data write and sense circuitry 36, and memory cell selection and control circuitry 38. The data write and sense circuitry 36 may read data from and may write data to selected memory cells 12. In an exemplary embodiment, data write and sense circuitry 36 may include a plurality of data sense amplifiers. Each data sense amplifier may receive at least one bit line (BL) 32 and an output of reference generator circuitry (for example, a current or voltage reference signal). For example, the data sense amplifier may be a cross-coupled type sense amplifier to sense the data state stored in memory cell 12 and/or write-back data into memory cell 12.

The data sense amplifier may employ voltage and/or current sensing circuitry and/or techniques. In an exemplary embodiment, the data sense amplifier may employ a current sensing circuitry and/or techniques, a current sense amplifier may compare the current from the selected memory cell 12 to a reference current, for example, the current of one or more reference cells. From that comparison, it may be determined whether memory cell 12 contained a logic high (binary "1" data state, relatively more majority charge carriers 34 contained within the body region 18) or a logic low (binary "0" data state, relatively less majority charge carriers 34 contained within the body region 18). It may be appreciated by one having ordinary skill in the art, any type or form of data write and sense circuitry 36 (including one or more sense amplifiers, using voltage or current sensing techniques, to sense the data state stored in memory cell 12) to read the data stored in memory cells 12 and/or write data in memory cells 12 may be employed.

Also, memory cell selection and control circuitry 38 may select and/or enable one or more predetermined memory cells 12 to facilitate reading data therefrom and/or writing data thereto by applying control signals on one or more word lines (WL) 28 and/or source lines (SL) 30. The memory cell selection and control circuitry 38 may generate such control signals using address data, for example, row address data. Moreover, memory cell selection and control circuitry 38 may include a word line decoder and/or driver. For example, memory cell selection and control circuitry 38 may include one or more different control/selection techniques (and circuitry therefor) to implement the memory cell selection technique. Such techniques, and circuitry therefor, are well known to those skilled in the art. Notably, all such control/selection techniques, and circuitry therefor, whether now known or later developed, are intended to fall within the scope of the present inventions.

In an exemplary embodiment, the semiconductor DRAM device may implement a two step write operation whereby all the memory cells 12 of a given row are written to a predetermined data state by first executing a "clear" operation, whereby all of the memory cells 12 of the given row are written to logic low (binary "0" data state), and thereafter selected memory cells 12 of the row are selectively written to the predetermined data state (here logic high (binary "1" data state)). The present disclosure may also be implemented in conjunction with a one step write operation whereby selective memory cells of the selected row are selectively written to either logic high (binary "1" data state) or logic low (binary "0" data state) without first implementing a "clear" operation.

The memory array may employ any of the exemplary writing, holding, and/or reading techniques described herein. Moreover, exemplary voltage values for each of the control signals for a given operation (for example, writing, holding or reading), according to exemplary embodiments of the present disclosure, is also provided.

The memory transistors 14 may be comprised of N-channel, P-channel and/or both types of transistors. Indeed, circuitry that is peripheral to the memory array (for example, sense amplifiers or comparators, row and column address decoders, as well as line drivers (not illustrated herein) may include P-channel and/or N-channel type transistors. Where P-channel type transistors are employed as memory cells 12 in the memory array(s), suitable write and read voltages (for example, negative voltages) are well known to those skilled in the art in light of this disclosure. Accordingly, for sake of brevity, these discussions will not be repeated.

Figure 4:
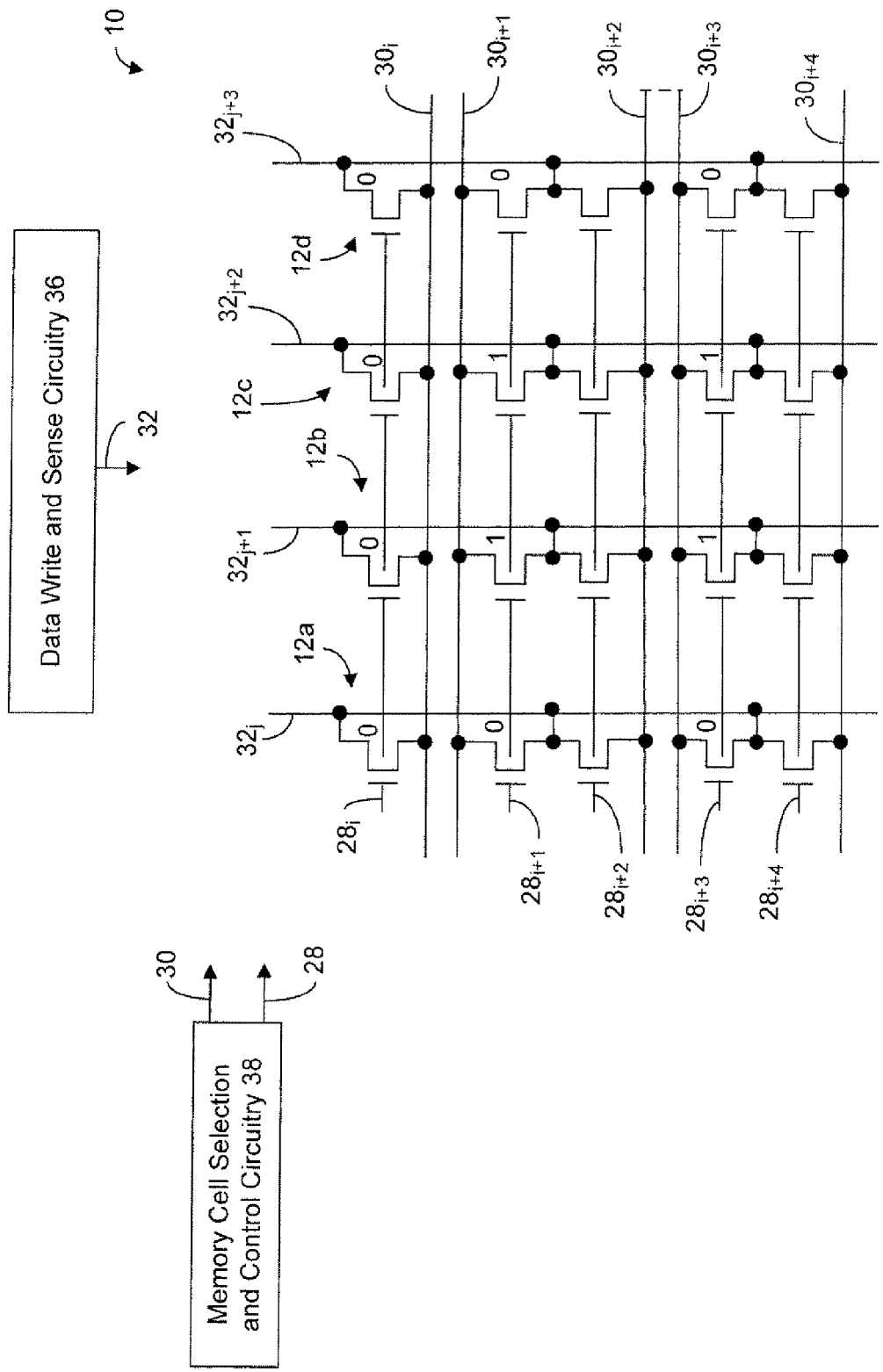
FIG. 4 shows an exemplary embodiment of a memory array having a plurality of memory cells and employing a separate source line configuration for each row of memory cells in accordance with an embodiment of the present disclosure.

Referring to FIG. 4, shows an exemplary embodiment of a memory array having a plurality of memory cells and employing a separate source line configuration for each row of memory cells in accordance with an embodiment of the present disclosure. In an exemplary embodiment, memory cells 12 may be written using the two step operation wherein a given row of memory cells 12 are written to a first predetermined data state by first executing a "clear" operation (which, in this exemplary embodiment, a selected row 28$_i$ and/or all of the memory cells 12 of the given row are written or programmed to logic low (binary "0" date state)) and thereafter selected memory cells 12 may be written to a second predetermined data state (i.e., a selective write operation to the second predetermined data state). The "clear" operation may be performed by writing each memory cell 12 of the given row to a first predetermined data state (in this exemplary embodiment the first predetermined data state is logic low (binary "0" data state) using the inventive technique described above.

In particular, memory transistor 14 of each memory cell 12 of a given row (for example, memory cells 12a-12d) is controlled to store a majority charge carrier concentration in the electrically floating body region 18 of the transistor 14 which corresponds to a logic low (binary "0" data state). For example, control signals to implement a "clear" operation may be applied to the gate 16, the source region 20, and the drain region 22 of the memory transistor 14 of memory cells 12a-12d. In an exemplary embodiment, a "clear operation" includes applying (i) 1.5V to the gate 16, (ii) 0V to the source region 20, and (iii) 0V to the drain region 22 of the memory transistor 14. In response, the same logic state (for example, logic low (binary "0" data state)) may be stored in memory cells 12a-12d and the state of memory cells 12a-12d may be "cleared". For example, it may be preferable to maintain the gate-to-source voltage below the threshold voltage of the transistor of memory cell 12 to further minimize or reduce power consumption.

Thereafter, selected memory cells 12 of a given row may be written to the second predetermined logic state. For example, the memory transistors 14 of certain memory cells 12 of a given row may be written to the second predetermined logic state in order to store the second predetermined logic state in memory cells 12. For example, memory cells 12b and 12c may be written to logic high (binary "1" data state) (as shown in a second selected row $28_{i+1}$), via an impact ionization effect and/or avalanche multiplication, by applying (i) −2.0V to the gate (via word line $28_i$), (ii) −2.0V to the source region (via source line $30_i$), and (iii) 1.5V to the drain region (via bit line $32_{j+1}$ and $32_{j+2}$). Particularly, such control signals may generate or provide a bipolar current in the electrically floating body region 18 of the memory transistor 14 of memory cell 12. The bipolar current may cause or produce impact ionization and/or the avalanche multiplication phenomenon in the electrically floating body region 18 of the memory transistors 14 of memory cells 12b and 12c. In this way, an excess of majority charge carriers may be provided and stored in the electrically floating body region 18 of the memory transistor 14 of memory cells 12b and 12c which corresponds to logic high (binary "1" data state).

In an exemplary embodiment, memory cells 12a and 12d (as shown in a second selected row $28_{i+1}$) may be maintained at logic low (binary "0" data state) by applying a voltage to inhibit impact ionization to the drain region 22 of each memory cell 12a and 12d. For example, applying 0V to the drain regions 22 of memory cells 12a and 12d (via bit lines $32_j$ and $32_{j+3}$) may inhibit impact ionization in memory cells 12a and 12d during the selective write operation for memory cells 12b and 12c.

Also, memory cells 12 (as shown in a third selected row $28_{i+3}$) may be selectively written to logic high (binary "1" data state) using the band-to-band tunneling (GIDL) method. As mentioned above, the band-to-band tunneling provides, produces and/or generates an excess of majority charge carriers in the electrically floating body 18 of the memory transistors 14 of each selected memory cell 12 (in this exemplary embodiment, memory cells 12b and 12c). For example, after implementing the "clear" operation, memory cells 12b and 12c may be written to logic high (binary "1" data state), via band-to-band tunneling, by applying (i) −3V to the gate 16 (via word line $28_i$), (ii) −0.5V to the source region 20 (via source line $30_i$), and (iii) 1.0V to the drain region 22 (via bit line $32_{j+1}$ and $32_{j+2}$).

A selected row of memory cells 12 may be read by applying a read control signals to the associated word line (WL) 28 and associated source lines (SL) 30 and sensing a signal (voltage and/or current) on associated bit lines (DL) 32. In an exemplary embodiment, memory cells 12a-12d (e.g., as shown in a third selected row $28_{i+3}$) may be read by applying (i) −0.5V to the gate 16 (via word line $28_i$) and (ii) 3.0V to the source region 20 (via source line $30_i$). The data write and sense circuitry 36 may read data state of the memory cells 12a-12d by sensing the response to the read control signals applied to word line $28_i$ and source line $30_i$. In response to the read control signals, memory cells 12a-12d may generate a bipolar transistor current which may be representative of data state of memory cells 12a-12d. For example, memory cells 12b and 12c (which were earlier written to logic high (binary "1" data state)), in response to the read control signals, may generate a bipolar transistor current which is considerably larger than any channel current. In contrast, memory cells 12a and 12d (which were earlier programmed to logic low (binary "0" data state)), such control signals induce, cause and/or produce little to no bipolar transistor current (for example, a considerable, substantial or sufficiently measurable bipolar transistor current). The circuitry in data write and sense circuitry 36 to sense the data state (for example, a cross-coupled sense amplifier) senses the data state using primarily and/or based substantially on the bipolar transistor current.

Thus, in response to read control signals, the memory transistor 14 of each memory cell 12a-12d may generate a bipolar transistor current which is representative of the data state stored therein. The data sensing circuitry in data write and sense circuitry 36 may determine data state of memory cells 12a-12d based substantially on the bipolar transistor current induced, caused and/or produced in response to the read control signals.

Figure 5:
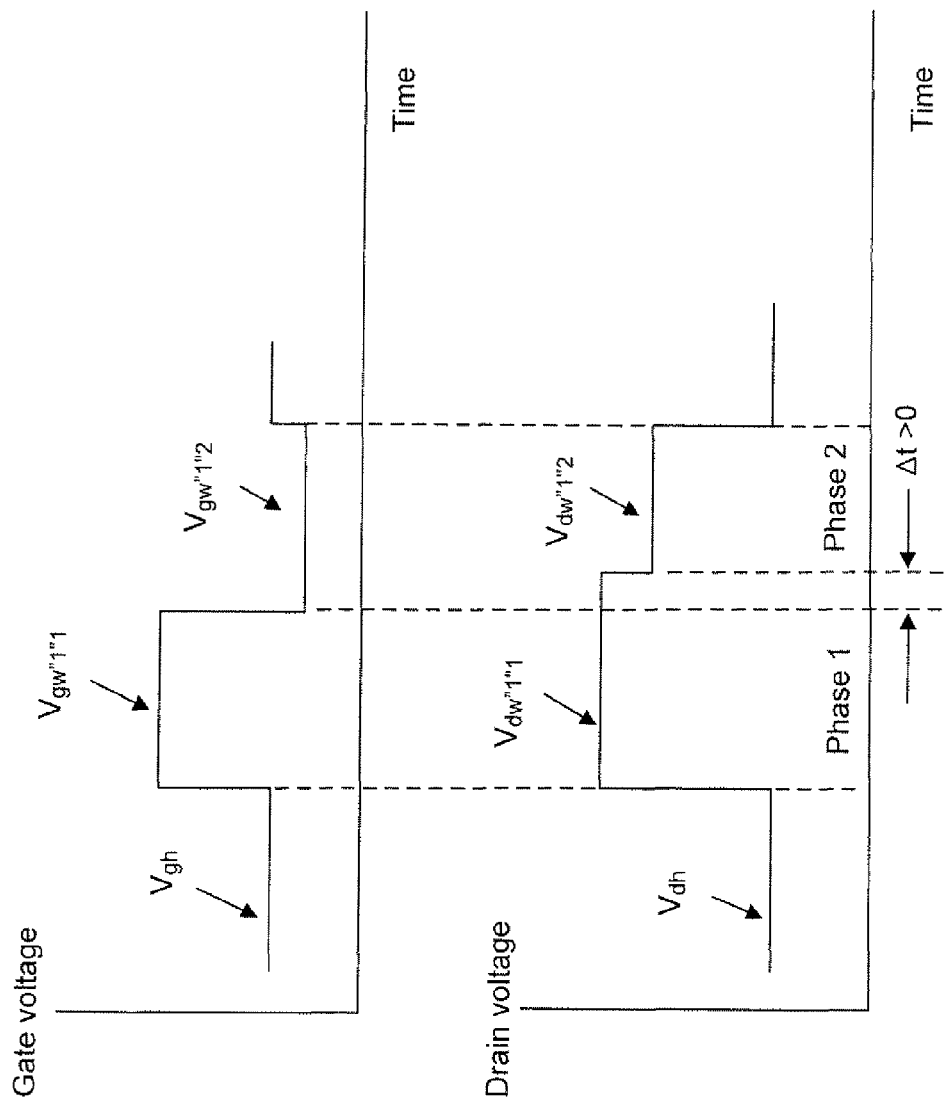
FIG. 5 shows a diagram of voltage control signals to implement a write operation for logic high or binary "1" data state into a memory cell in accordance with an embodiment of the present disclosure.

FIG. 5 shows a diagram of voltage control signals to implement a write operation for logic high (binary "1" data state) into a memory cell 12 in accordance with an exemplary embodiment of the present disclosure. The control signals may be configured to provide a lower power consumption as well as a one step write whereby selective memory cells 12 of a selected row of memory cells 12 may be selectively written or programmed to either logic high (binary "1" data state) or logic low (binary "0" date state) without first implementing a "clear" operation. For example, the temporally varying control signals to implement the write logic high (binary "1" data state) operation include the voltage applied to the gate 16 ($V_{gw"1"}$) and the voltage applied to the drain region 22 ($V_{dw"1"}$). The binary "1" or "0" data states may be written to one or more selected memory cells 12 by applying appropriate bit line voltages. For example, during phase 1, the drain voltage ($V_{dw"1"1}$) may be applied to the drain region 22 (via, for example, the associated bit line) of the memory transistor 14 of the memory cell 12 before the gate voltage ($V_{gw"1"1}$) may be applied to the gate 16 (via, for example, the associated word line), simultaneously thereto, or after the gate voltage ($V_{gw"1"1}$) is applied to gate 16. It is preferred that the drain voltage ($V_{dw"1"1}$) include an amplitude which may be sufficient to maintain a bipolar current that is suitable for programming the memory cell 12 to logic high (binary data state). From a relative timing perspective, it is preferred that the drain voltage ($V_{dw"1"1}$) extend beyond/after or continue beyond the conclusion of the gate voltage ($V_{gw"1"1}$), or extend beyond/after or continue beyond the time the gate voltage ($V_{gw"1"1}$) is reduced, as illustrated in FIG. 5 (see, Δt>0). Therefore, majority charge carriers may be generated in the electrically floating body region 18 via a bipolar current and majority charge carriers may accumulate (and be stored) in a portion of the electrically floating body region 18 of the memory transistor 14 of the memory cell 12 that may be juxtaposed or near the gate dielectric (which is disposed between the gate 16 and the electrically floating body region 18).

Also illustrated in FIG. 5, during phase 2 of the writing operation, the gate voltage ($V_{gw"1"2}$) may be equal to (or substantially equal to) the voltage applied to the gate 16 to implement a hold operation ($V_{gh}$) and the drain bias ($V_{dw"1"2}$) may be equal to (or substantially equal to) the voltage applied to the drain region to implement a hold operation ($V_{dh}$).

Figure 6:
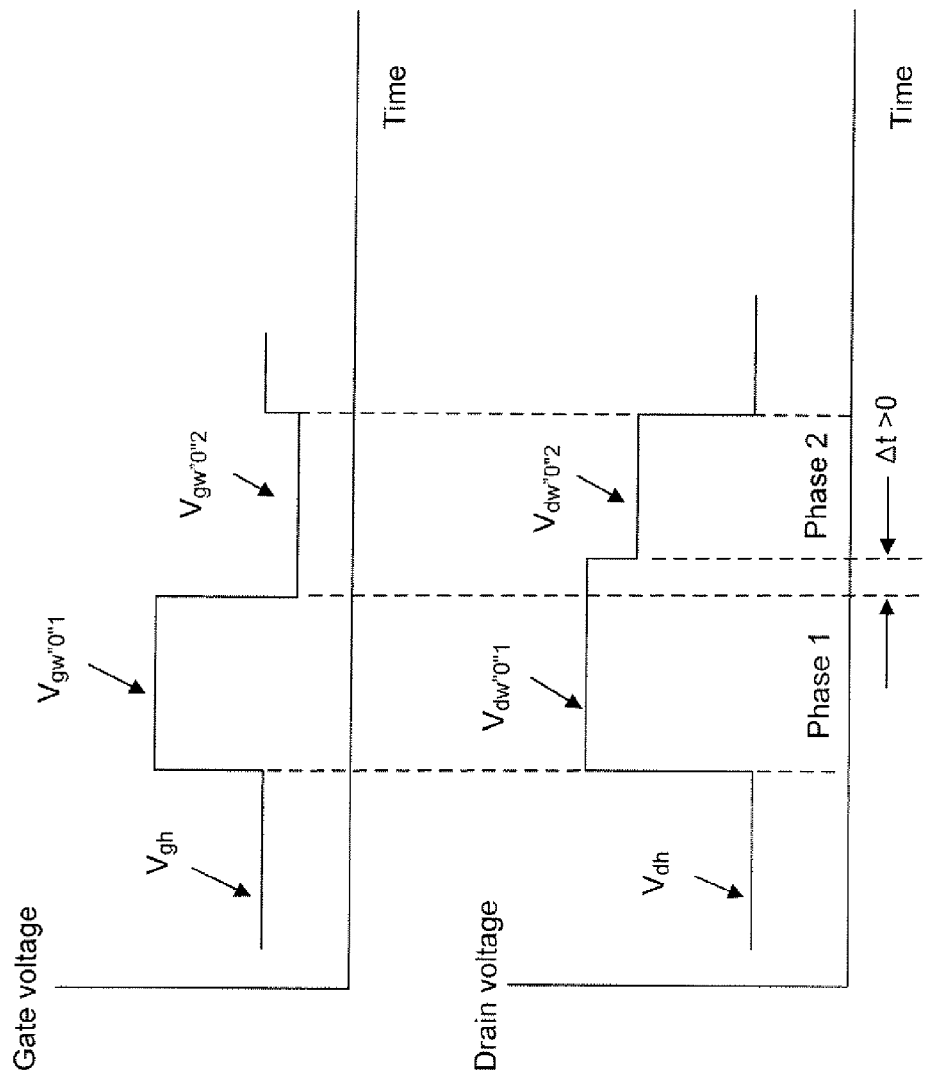
FIG. 6 shows a diagram of voltage control signals to implement a write operation for logic low or binary "0" data state into a memory cell in accordance with an embodiment of the present disclosure.

FIG. 6 shows a diagram of voltage control signals to implement a write operation for logic low (binary "0" data state) into a memory cell in accordance with an embodiment of the present disclosure. The temporally varying control signals that may be implemented to write logic low (binary "0" data state) may include the voltage applied to the gate 16 ($V_{gw"0"}$) and the voltage applied to the drain region 22 ($V_{dw"0"}$). For example, during phase 1, the control signal applied to the drain region may be applied before the control signal is applied to the gate 16 ($V_{dw"0"1}$), or simultaneously thereto, or after the control signal is applied to the gate 16. Particularly, the drain voltage ($V_{dw"0"1}$) may include an amplitude which may be insufficient to maintain a bipolar current that is suitable for writing the memory cell 12 to logic high (binary "1" data state). From a relative timing perspective, it may be preferred that the drain voltage ($V_{dw"0"1}$) extend beyond/after or continue beyond the conclusion of the gate voltage ($V_{dw"0"1}$), or extend beyond/after or continue beyond the time the gate voltage ($V_{gw"0"1}$) is reduced, as illustrated in FIG. 6 (see, $\Delta t>0$). For example, majority charge carriers may be generated in the electrically floating body region 18 via a bipolar current and majority charge carriers may be accumulated (and be stored) in a portion of the electrically floating body region 18 of the memory transistor 14 of the memory cell 12 that is juxtaposed or near the gate dielectric (which is disposed between the gate 16 and the electrically floating body region 18).

Like phase 2 of the write logic high (binary "1" data state) described above, during phase 2 of the write operation for logic low (binary "0" data state), the gate voltage ($V_{gw"0"2}$) may be equal to (or substantially equal to) the voltage applied to the gate 16 to implement a hold operation ($V_{gh}$) and the drain bias ($V_{dw"0"2}$) may be equal to (or substantially equal to) the voltage applied to the drain region 22 to implement a hold operation ($V_{dh}$).

In the preceding discussion pertaining to an exemplary write operation, the reference to a first phase and a second phase of a write operation was used for explanation purposes to highlight changes in voltage conditions of control signals in the exemplary embodiments. It may be advantageous, when writing binary "1" and "0" data states, to apply constant or non-changing voltages to gate 16, drain region 22, and/or source region 20 during or through what has been labeled as write phases 1 and 2.

Figure 7:
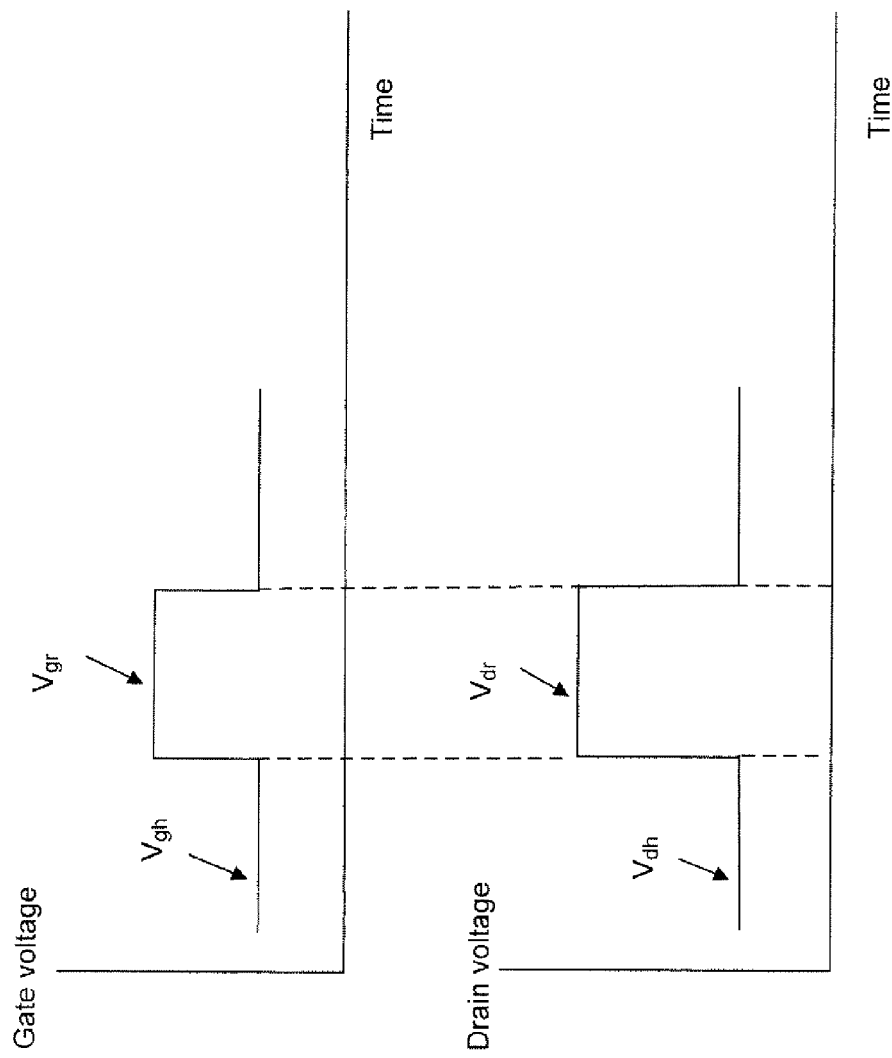
FIG. 7 shows a diagram of voltage control signals to implement a read operation of a memory cell in accordance with an embodiment of the present disclosure.

FIG. 7 shows a diagram of voltage control signals to implement a read operation of a memory cell in accordance with an embodiment of the present disclosure. For example, read control signals may be applied to the drain region 22 and the gate 16. The voltage applied to the drain region 22 ($V_{dr}$) may be applied to drain region 22 before application of the voltage applied to the gate 16 ($V_{gr}$), simultaneously thereto, or after the voltage is applied to the gate 16. Further, the drain voltage ($V_{dr}$) may cease or terminate before the gate voltage ($V_{gr}$), simultaneously thereto (as illustrated in FIG. 7), or after the gate voltage ($V_{gr}$) may conclude or cease.

In an exemplary embodiment, during the read operation, bipolar current is generated in memory cells 12 storing logic high (binary "1" data state) and little to no bipolar current is generated in memory cells 12 storing logic low (binary "0" data state). The data state may be determined primarily by, sensed substantially using and/or based substantially on the bipolar transistor current that is responsive the read control signals and significantly less by the interface channel current component, which is less significant and/or negligible relatively to the bipolar component.

The writing and reading techniques described herein may be employed in conjunction with a plurality of memory cells 12 arranged in an array of memory cells. A memory array implementing the structure and techniques of the present inventions may be controlled and configured including a plurality of memory cells 12 having a separate source line (SL) for each row of memory cells 12 (a row of memory cells includes a common word line). The exemplary layouts or configurations (including exemplary control signal voltage values), in accordance to one or more exemplary embodiments of the present disclosure are shown, each consisting of the control signal waveforms and exemplary array voltages during one-step writing phase 1, phase 2, and reading.

Figure 8:
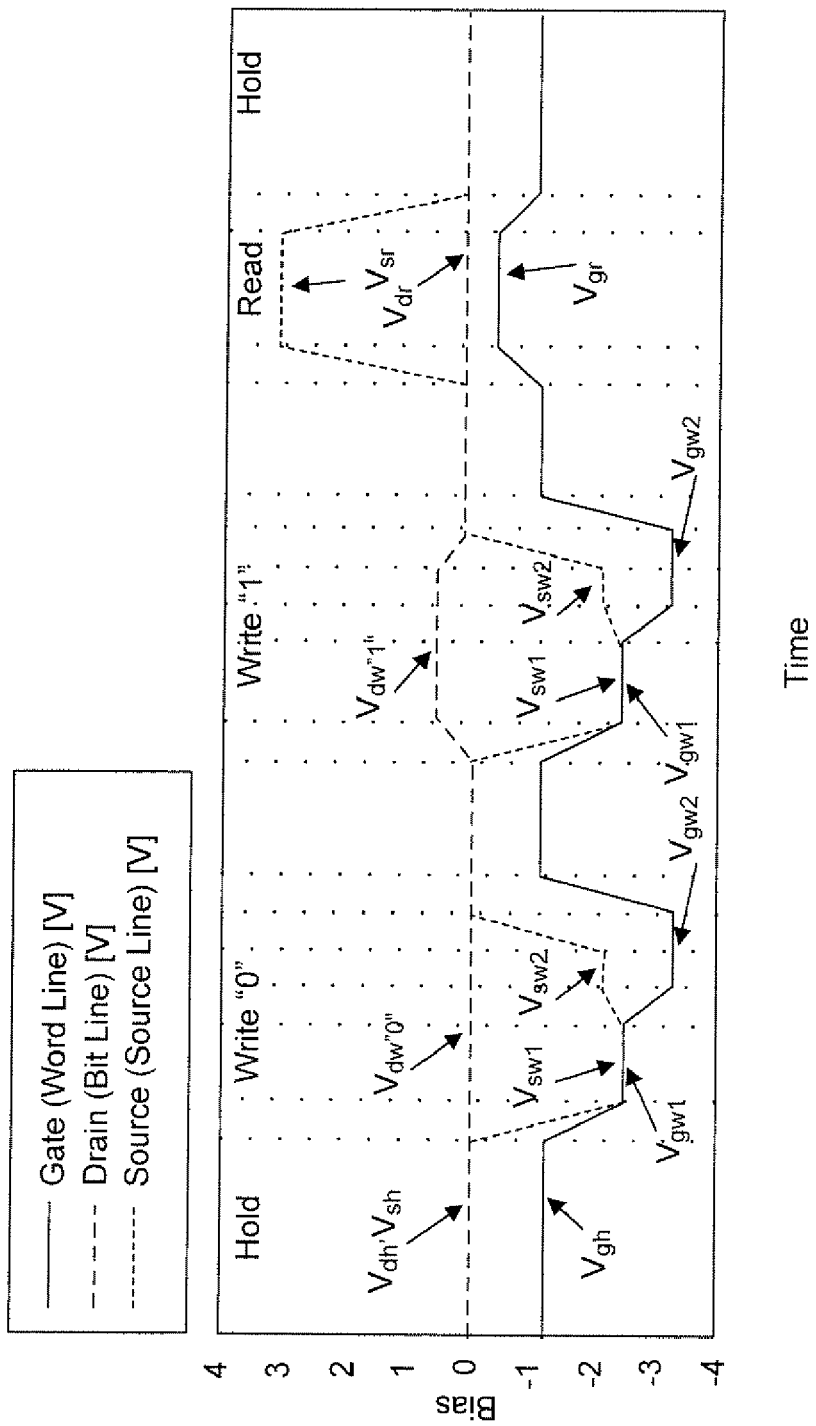
FIG. 8 shows control signal information (temporal and amplitude) to implement a read/write operation in accordance with an embodiment of the present disclosure.

Referring to FIG. 8, shows control signal information (temporal and amplitude) to implement a read/write operation in accordance with an embodiment of the present disclosure. For example, the temporally varying control signals to implement a write operation may include (i) a voltage applied to the gate 16 ($V_{gw}$) via the associated word line (WL), (ii) a voltage applied to the source region 20 ($V_{sw}$) via the source line (SL), and (iii) a voltage applied to the drain region 22 ($V_{dw}$) via the associated bit line (BL). The binary "1" or "0" data states may be written to one or more selected memory cells 12 by applying appropriate bit line voltages. In an exemplary embodiment, logic high (binary "1" data state) may be written into a memory cell 12 by applying drain voltage ($V_{dw"1"}$) having an amplitude of 0.5V, and logic low (binary "0" data state) may be written into a memory cell 12 by applying the drain voltage ($V_{dw"0"}$) having an amplitude of 0V. In addition, during phase 1 of the write operation, the source voltage ($V_{sw1}$) may include an amplitude of –2.5V and the gate voltage ($V_{gw1}$) may include an amplitude of –2.5V. During phase 2 of the write operation, the source voltage ($V_{sw2}$) may include an amplitude of –2.2V and the gate voltage ($V_{gw2}$) may include an amplitude of –3.3V. For example, under these conditions, a bipolar current that is suitable for writing the memory cell 12 to logic high (binary "1" data state) may be provided. Moreover, under these conditions, little to no bipolar current is generated for writing the memory cell to logic low (binary "0" data state).

A row of memory cells (e.g., 12a-12d) may be read in series and/or in parallel. In this embodiment, memory cells 12 are read by applying the following read control signals: (i) a voltage applied to the gate 16 ($V_{gr}$) via the associated word line (WL) and (ii) a voltage applied to the source ($V_{sr}$) via the source line (SL). The logic state of each memory cell (e.g., 12a-12d) may be sensed, determined and/or sampled on the associated bit line (BL) ($32_j$-$32_{j+3}$, respectively). In particular, during the read operation, the gate voltage ($V_{gr}$) may include an amplitude of –0.5V and the source voltage ($V_{sr}$) may include an amplitude of 3.0V.

Notably, during the read operation, a bipolar current may be generated in memory cells 12 storing logic high (binary "1" data state) and little to no bipolar current may be generated in memory cells 12 storing logic low (binary "0" data state). The data state may be determined primarily by, sensed substantially using and/or based substantially on the bipolar transistor current that is responsive to the read control signals and significantly less by the interface channel current component, which is less significant and/or negligible relatively to the bipolar component.

Accordingly, the illustrated/exemplary voltage levels to implement the write and read operations are merely exemplary. The indicated voltage levels may be relative or absolute. Alternatively, the voltages indicated may be relative in that each voltage level, for example, may be increased or decreased by a given voltage amount (e.g., each voltage may be increased or decreased by 0.5V, 1.0V and 2.0V) whether one or more of the voltages (e.g., the source region voltage, the drain region voltage or gate voltage) become or are positive and negative.

Figure 9:
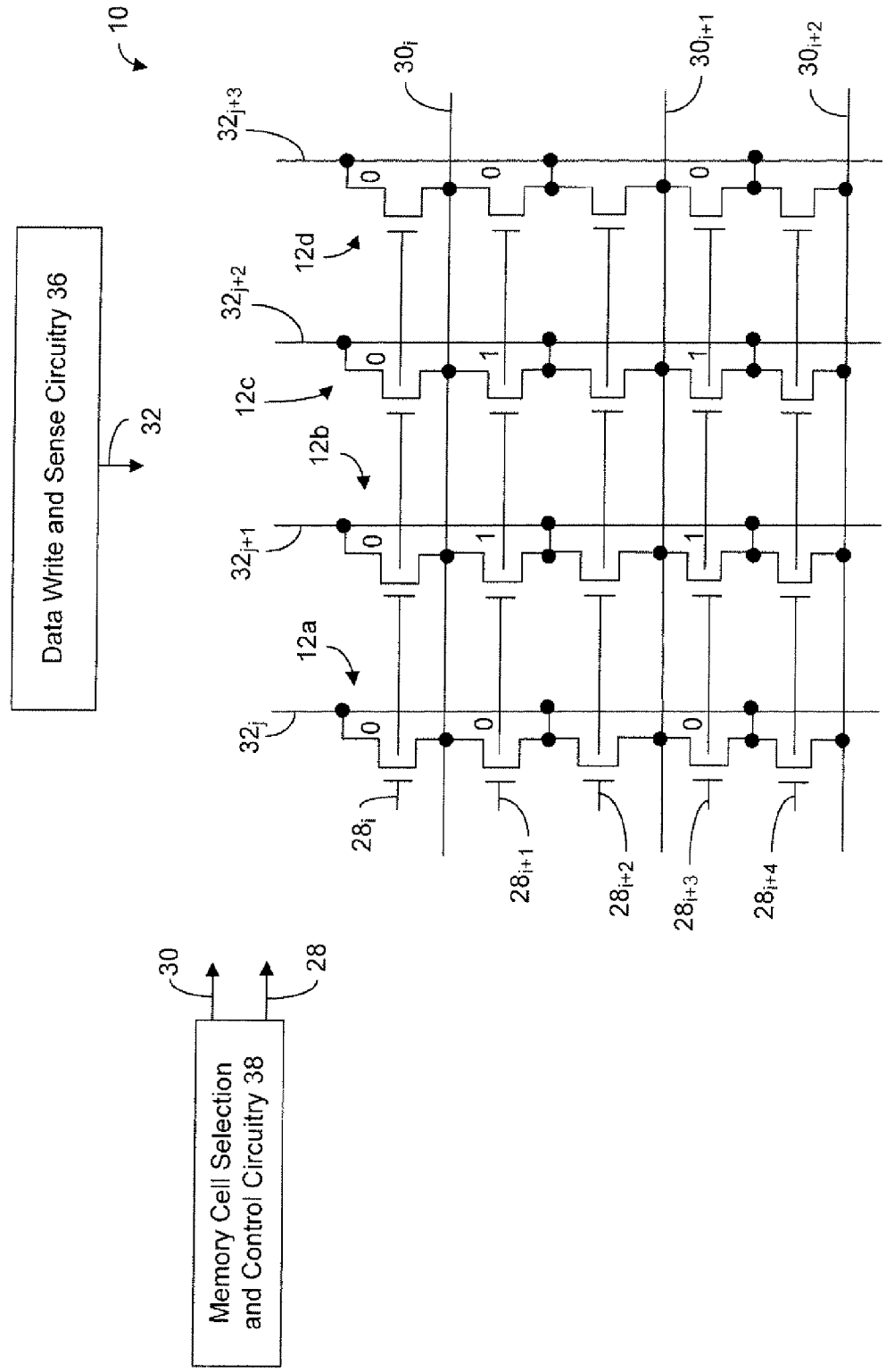
FIG. 9 shows a schematic of a memory array implementing the structure and techniques having a common source line in accordance with an embodiment of the present disclosure.
Figure 10:
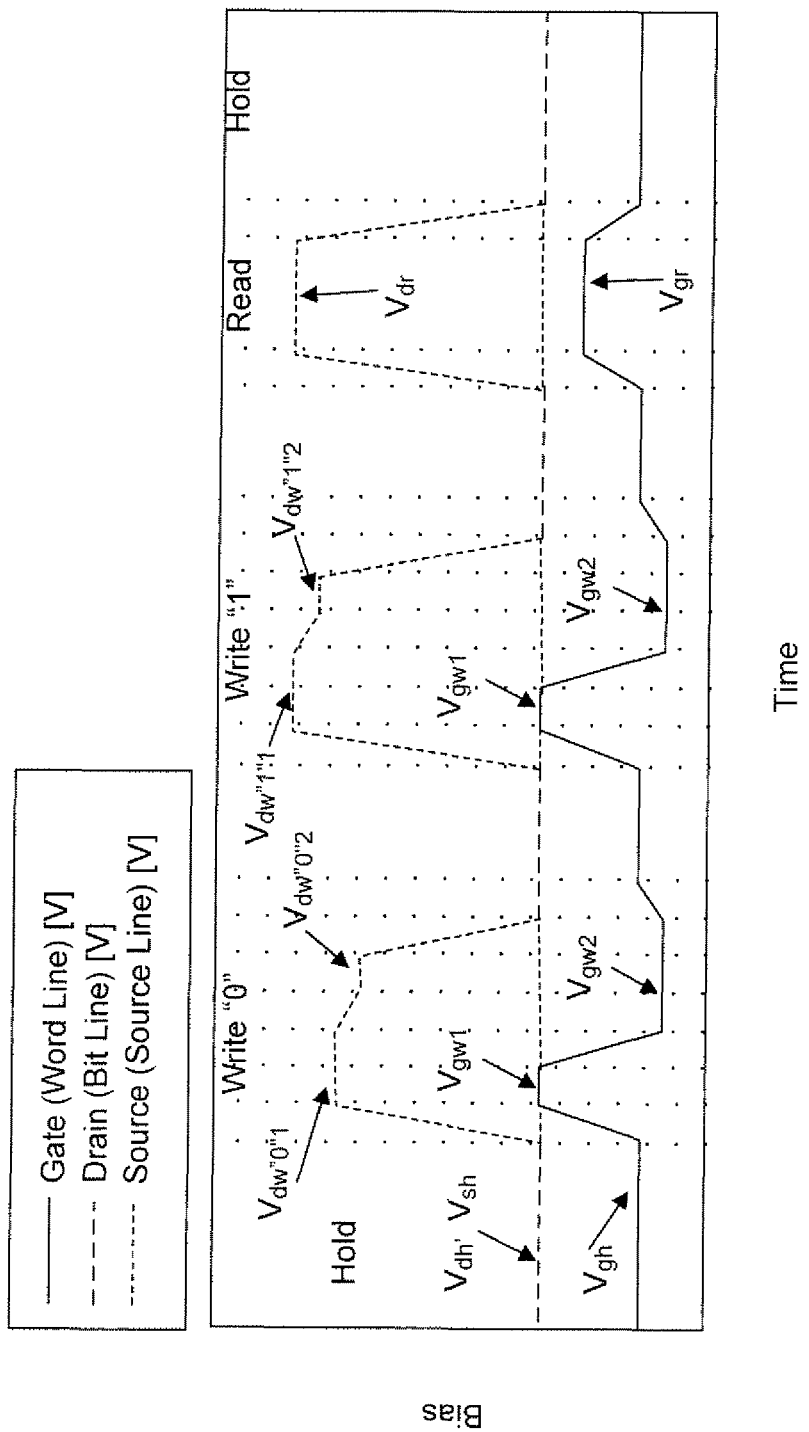
FIG. 10 shows control signal information (temporal and amplitude) to implement a read/write operation in accordance with an embodiment of the present disclosure.

Referring to FIGS. 9 and 10, show a schematic of a memory array implementing the structure and techniques having a common source line (SL) in accordance with an exemplary embodiment of the present disclosure. As mentioned above, the present disclosure may be implemented in any memory array architecture having a plurality of memory cells that employ memory transistors. For example, as illustrated in FIGS. 9 and 10, a memory array implementing the structure and techniques of the present disclosure may be controlled and configured having a common source line (SL) for every two rows of memory cells 12 (a row of memory cells 12 includes a common word line (WL)). An example (including exemplary control signal voltage values), according to certain aspects of the present disclosure may be also shown that consists of the control signal waveforms and exemplary array voltages during one-step writing phase 1, phase 2, and reading.

For example, the temporally varying control signals to implement the write operation may include (i) a voltage applied to the gate ($V_{gw}$) via the associated word line (WL) and (ii) a voltage applied to the drain region ($V_{dw}$) via the associated bit line (BL). The binary "1" or "0" data states may be written to one or more selected memory cells 12 by applying appropriate bit line voltages. Thereby, logic high (binary "1" data state) may be written into a memory cell 12 by applying drain voltage ($V_{dw\text{"1"}}$) having (i) an amplitude of 3V during phase 1 and (ii) an amplitude of 2.7V during phase 2. Conversely, logic low (binary "0" data state) may be written into a memory cell by applying the drain voltage ($V_{dw\text{"0"}}$) having (i) an amplitude of 2.5V during phase 1 and (ii) an amplitude of 2.2V during phase 2. In addition, during phase 1 of the write operation, the gate voltage ($V_{gw1}$) may include an amplitude of 0V. During phase 2 of the write operation, the gate voltage ($V_{gw2}$) may include an amplitude of −1.5V. The voltage applied to the source lines (SL) (and, as such, the source regions 20 of the memory transistors 14 of the row of memory cells 12) may be 0V. Under these conditions, a bipolar current that may be suitable for writing the memory cell to logic high (binary "1" data state) is provided. Moreover, little to no bipolar current is generated for programming the memory cell to logic low (binary "0" data state).

As noted above, in the preceding discussions pertaining to an exemplary write operation, the reference to a first phase and a second phase of a write operation was used for explanation purposes to highlight changes in voltage conditions of control signals in the exemplary embodiments. It may be advantageous, when writing binary "1" or "0" data states, to apply constant or non-changing voltages to gate 16, drain region 22, and/or source region 20 during or through what has been labeled as write phases 1 and 2.

A row of memory cells (for example, 12a-12d) may be read in series and/or parallel. The memory cells 12 may be read by applying the following read control signals: (i) a voltage applied to the gate ($V_{gr}$) via the associated word line (WL) and (ii) a voltage applied to the drain ($V_{dr}$) via the associated bit line (BL). The logic state of each memory cell 12 (for example, 12a-12d) is sensed, determined, and/or sampled on the associated bit line (BL) ($32_j$-$32_{j+3}$, respectively). In particular, during the read operation, the gate voltage ($V_{gr}$) may include an amplitude of −0.5V and the drain voltage ($V_{dr}$) may include an amplitude of 3V. The voltage applied to the source lines (SL) (and, as such, the source regions 20 of the memory transistors 14 of the row of memory cells 12) is 0V.

As noted above, during the read operation, a bipolar current may be generated in those memory cells 12 storing logic high (binary "1" data state) and little to no bipolar current may be generated in those memory cells 12 storing logic low (binary "0" data state). The data state may be determined primarily by, sensed substantially using, and/or based substantially on the bipolar transistor current that is responsive to the read control signals and significantly less by the interface channel current component, which may be less significant and/or negligible relatively to the bipolar component.

It may be advantageous to employ a "holding" operation or condition for de-selected memory cells 12 (e.g., idle memory cells 12) in memory cell array to minimize and/or reduce the impact of the write/read operations for selected memory cells 12 (e.g., memory cells 12 being written to and/or read from) connected to word lines $28_i$, $28_{i+1}$, $28_{i+2}$, $28_{i+3}$, and $28_{i+4}$. Referring to again to FIGS. 4 and 9, a holding voltage may be applied to the gates 16 of the memory transistors 14 of the de-selected memory cells 12 of memory cell array 10 (for example, memory cells 12 connected to word lines $28_{i+1}$, $28_{i+2}$, $28_{i+3}$, and $28_{i+4}$). In a preferred exemplary embodiment, a holding voltage applied to the de-selected memory cells 12 may be approximate to an operation voltage applied to the selected memory cells 12 to perform the write/read operations. By applying a holding voltage approximate to an operation voltage for performing the write/read operations, the voltage swing between the holding voltage and the operation voltage may be reduced. By reducing the voltage swing between the holding voltage and the operation voltage, a power consumption may be reduced because (i) only voltage applied to selected bit lines (e.g., associated with the selected memory cells 12) may be varied, and (ii) the source line voltage swing (e.g., between holding condition and write/read operations) may be reduced. In addition, by reducing the voltage swing between the holding voltage and the operation voltage, a circuit size may be reduced, for example, reducing one or more components (e.g., reduce a number of transistors cascoded in series) for a source line driver.

Figure 11:
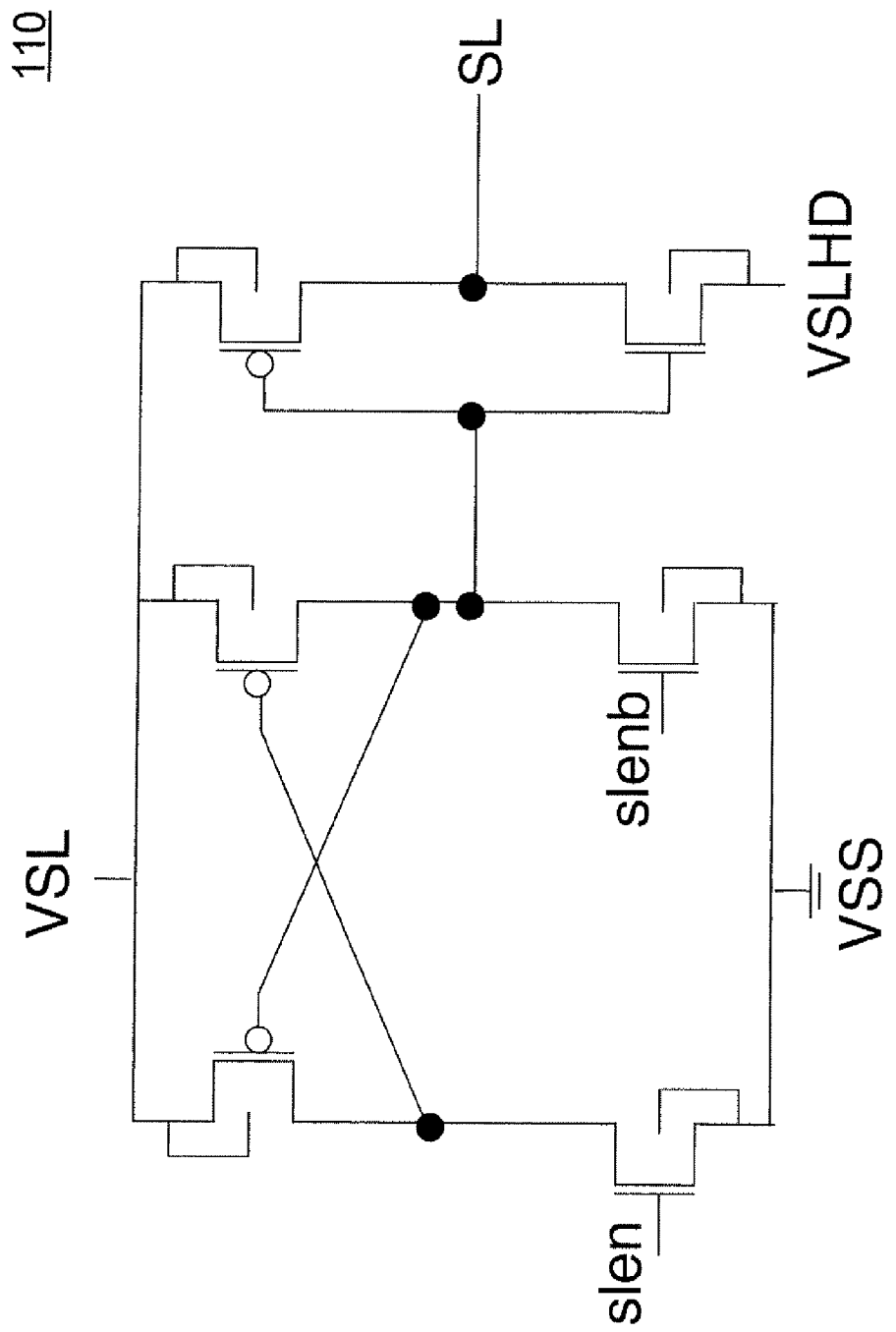
FIG. 11 shows a schematic circuit diagram of a voltage driver in accordance with an embodiment of the present disclosure.

Referring to FIG. 11, shows a schematic diagram of a voltage driver 110 in accordance with an embodiment of the present disclosure. In an exemplary embodiment, the voltage driver 110 may be arranged in an inverter circuit configuration and/or other circuit configurations having one or more transistors cascoded in series for generating one or more voltage potentials. As illustrated in FIG. 11, a ground (VSS) may be coupled to the voltage driver 110. Conventionally, the ground (VSS) may be held at 0V during a holding operation or condition. In an exemplary embodiment, the voltage swing between the holding voltage and the operation voltage may be reduced by raising the voltage applied to the switch low supply (VSLHD) to a higher voltage (e.g., VSLHD>0V) or a voltage potential similar to the operation voltage. For example, the voltage driver 110 may apply a holding voltage approximately in a range of 0.5V to 1.5V to the source region 20 and/or drain region 22 of each memory transistor 14 of the one or more de-selected memory cells 12 connected to word lines (WL) $28_{i+1}$, $28_{i+2}$, $28_{i+3}$ and $28_{i+4}$.

Figure 12:
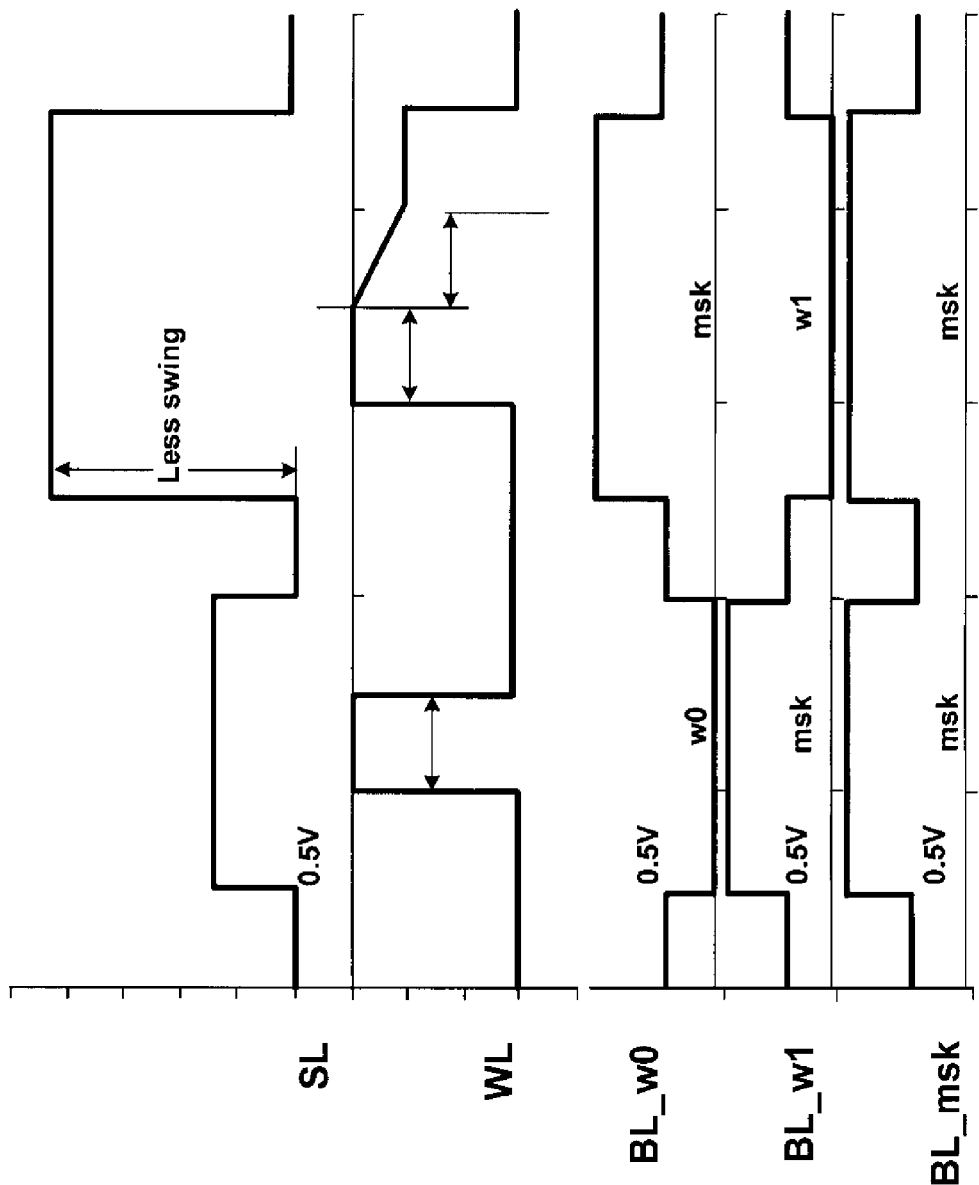
FIG. 12 shows a diagram of voltage control signals to implement a write operation into a memory cell in accordance with an embodiment of the present disclosure.

Referring to FIG. 12, shows a diagram of voltage control signals to implement a program or write operation into a memory cell in accordance with an embodiment of the present disclosure. The control signals may be configured to provide a low voltage swing between a holding operation or condition and/or a write operation and thus lower power consumption as well. For example, the temporally varying control signals to implement the write operation may include a voltage applied to the source region 20 ($V_{sw}$), a voltage applied to the gate ($V_{gw}$), and a voltage applied to the drain region 22 ($V_{dw}$). The binary "1" or "0" data states may be written to one or more selected memory cells 12 by applying appropriate bit line voltages. For example, a voltage swing between a holding voltage and a writing voltage may be reduced by raising the holding voltage and thus reducing power consumption. Also, during the holding operation or condition, a voltage applied to the source line (SL) and a voltage applied to the bit line (BL) may be the same as the voltage applied during a write operation in order to reduce the voltage swing. As illustrated in FIG. 12, during an initial holding operation or condition, the voltage applied to the source line (SL) and the voltage applied to the bit line (BL) may be 0.5V. Also during the initial holding operation or condition, a voltage may be in the range of −0.2V to −1.8V and applied to the word line (WL).

During a write logic low (binary "0" data state) phase, the control signal applied to the drain region 22 ($V_{dw\text{"0"}}$) may be applied before the control signal is applied to the gate 16 ($V_{gw\text{"0"}}$), or simultaneously thereto, or after the control signal is applied to the gate 16. As shown in FIG. 12, by maintaining the holding voltage at 0.5V, the voltage swing between the control signal applied to the drain region 22 during the write operation and the control signal applied during the holding voltage may be reduced. The drain voltage ($V_{dw\text{"0"}}$) may include an amplitude which is insufficient to maintain a bipolar current that is suitable for writing the memory cell to logic high (binary "1" data state). From a relative timing perspective, it may be preferred that the drain voltage ($V_{dw\text{"0"}1}$) extend beyond/after or continue beyond the conclusion of the gate voltage ($V_{gw\text{"0"}1}$), or extend beyond/after or continue beyond the time the gate voltage ($V_{gw\text{"0"}1}$) is reduced, as illustrated in FIG. 12. For example, majority charge carriers may be generated in the electrically floating body region 18 via a bipolar current and majority charge carriers may accumulate (and be stored) in a portion of the electrically floating body region of the memory transistor 14 of the memory cell 12 that is juxtaposed or near the gate dielectric (which is disposed between the gate 16 and the electrically floating body region 18).

During a write logic high (binary "1" data phase) phase, the drain voltage ($V_{dw\text{"1"}}$) may be applied to the drain region 22 (via, for example, the associated bit line (BL)) of the memory transistor 14 of the memory cell 12 before the gate voltage ($V_{gw\text{"1"}}$) may be applied to the gate 16 (via, for example, the associated word line), simultaneously thereto, or after the gate voltage ($V_{gw\text{"1"}}$) is applied to gate 16. As shown in FIG. 12, by maintaining the holding voltage at 0.5V, the voltage swing between the control signal applied to the drain region 22 during the writing operation and the control signal applied during the holding voltage may be reduced. It is preferred that the drain voltage ($V_{dw\text{"1"}}$) include an amplitude which may be sufficient to maintain a bipolar current that is suitable for programming the memory cell 12 to logic high (binary "1" data state). From a relative timing perspective, it is preferred that the drain voltage ($V_{dw\text{"1"}}$) extend beyond/after or continue beyond the conclusion of the gate voltage ($V_{gw\text{"1"}}$), or extend beyond/after or continue beyond the time the gate voltage ($V_{gw\text{"1"}}$) is reduced. Therefore, majority charge carriers may be generated in the electrically floating body region 18 via a bipolar current and majority charge carriers may be accumulated (and be stored) in a portion of the electrically floating body region 18 of the memory transistor 14 of the memory cell 12 that may be juxtaposed or near the gate dielectric (which is disposed between the gate 16 and the electrically floating body region 18).

During a mask write phase, the drain voltage ($V_{dw\text{"msk"}}$) may be applied to the drain region 22 (via, for example, the associated bit line) of the memory transistor 14 of the memory cell 12 before the gate voltage ($V_{gw\text{"1"}}$) may be applied to the gate 16 (via, for example, the associated word line), simultaneously thereto, or after the gate voltage ($V_{gw\text{"1"}}$) is applied to gate 16. As shown in FIG. 12, by maintaining the holding voltage at 0.5V, the voltage swing between the control signal applied to the drain region 22 during the mask writing operation and control signal applied during the holding voltage may be reduced.

Figure 13:
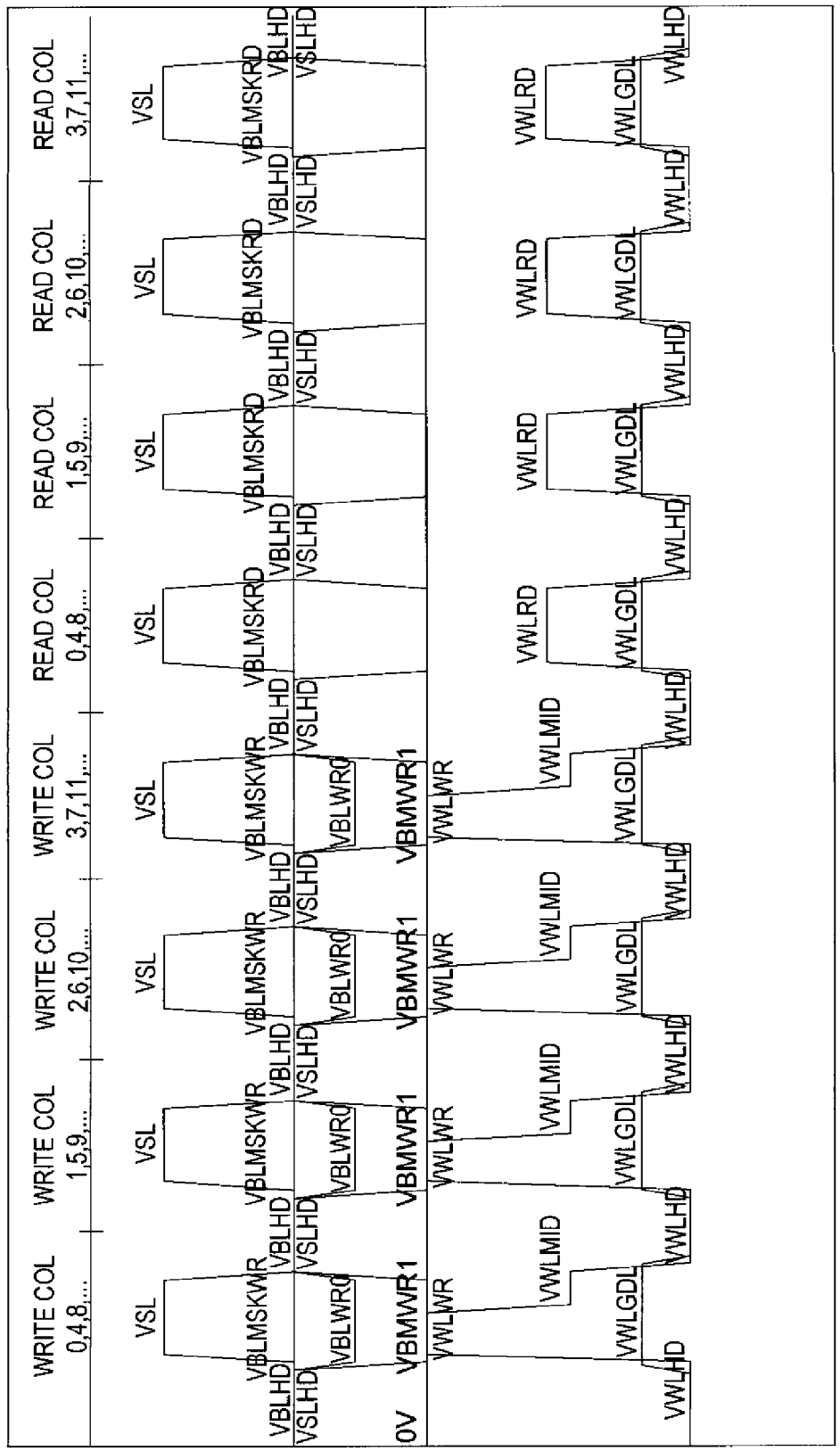
FIG. 13 shows control signal information (temporal and amplitude) to implement a read/write operation in accordance with an embodiment of the present disclosure.

Referring to FIG. 13, shows control signal information (temporal and amplitude) to implement a write/read operation in accordance with an embodiment of the present disclosure. For example, the temporally varying control signals to implement a holding operation or condition may include (i) a voltage applied to the gate 16 via the associated word line ($VWL_{HD}$), (ii) voltage applied to the source region 20 via the source line ($VSL_{HD}$), and (iii) a voltage applied to the drain region 22 via the associated bit line ($VBL_{HD}$). In an exemplary embodiment, in order to reduce a voltage swing between the holding voltage (e.g., for de-selected cells 12) and the operation voltage (e.g., for selected cells 12), a holding voltage applied to the word line ($VWL_{HD}$) may be −1.2V, a holding voltage applied to the source line ($VSL_{HD}$) may be 1.1V, and a holding voltage applied to the bit line ($VBL_{HD}$) may be 1.1V. For example, the temporally varying control signals to implement a write operation may include (i) a voltage applied to the gate 16 via the associated word line ($VWL_{WR}$) (ii) a voltage applied to the source region 20 via the source line ($VSL_{WR}$), and (iii) a voltage applied to the drain region 22 via the associated bit line ($VBL_{WR}$). In an exemplary embodiment, binary "1" or "0" data states may be written to one or more selected memory cells 12 by applying appropriate bit line voltages. In an exemplary embodiment, logic high (binary "1" data state) may be written into a memory cell 12 by applying drain voltage ($VBL_{WR\text{"1"}}$) having an amplitude of 0.0V, and logic low (binary "0" data state) may be written into a memory cell 12 by applying the drain voltage ($VBL_{WR\text{"0"}}$) having an amplitude of 0.5V. Moreover, a mask writing operation may be employed by applying an appropriate bit line voltage ($VBLMSK_{WR}$). For example, a mask voltage applied to the bit line ($VBLMSK_{WR}$) may be 1.1V. In addition, during the writing operation, the voltage applied to the source voltage (VSL) may include an amplitude of 2.5V and the gate voltage ($VWL_{WR}$) may include an amplitude of 0.3V, Moreover, a control voltage may be applied to the word line ($VWL_{MID}$) in order to control a writing operation (e.g., writing a logic "1"). For example, the control voltage applied to the word line ($VWL_{MID}$) may be approximately −0.9V.

Also, the temporally varying control signals to implement a read operation may include (i) a voltage applied to the gate 16 via the associated word line ($VWL_{RD}$) (ii) a voltage applied to the source region 20 via the source line ($VSL_{RD}$) and (iii) voltage applied to the drain region 22 via the associated bit line ($VBL_{RD}$). A row of memory cells (e.g., 12a-12d) may be read in series and/or in parallel. The logic state of each memory cell (e.g., 12a-12d) may be sensed, determined, and/or sampled on the associated bit line ($32_j$-$32_{j+3}$, respectively). In particular, during the read operation, the gate voltage ($VWL_{RD}$) may include an amplitude of −0.5V, the source voltage ($VSL_{RD}$) may include an amplitude of 2.5V, and the drain voltage ($VBL_{RD}$) may include an amplitude of 0V. Also, a mask read operation may be executed by applying a drain voltage ($VBLMSK_{RD}$) of approximately 1.1V.

FIG. 13 also illustrates a voltage applied to a word line (VWL$_{GDL}$) in order to reduce band-to-band tunneling (gate-induced drain leakage "GIDL"), as described above. For example, the voltage applied to the word line (VWL$_{GDL}$) may be approximately −0.9V.

Accordingly, the illustrated/exemplary voltage levels to implement the hold, write, and read operations are merely exemplary. The indicated voltage levels may be relative or absolute. Alternatively, the voltages indicated may be relative in that each voltage level, for example, may be increased or decreased by a given voltage amount (e.g., each voltage may be increased or decreased by 0.5V, 1.0V and 2.0V) whether one or more of the voltages (e.g., the source region voltage, the drain region voltage or gate voltage) become or are positive and negative.

At this point it should be noted that reducing a voltage swing in accordance with the present disclosure as described above typically involves the processing of input data and the generation of output data to some extent. This input data processing and output data generation may be implemented in hardware or software. For example, specific electronic components may be employed in a semiconductor DRAM device or similar or related circuitry for implementing the functions associated with reducing a voltage swing in accordance with the present disclosure as described above. Alternatively, one or more processors operating in accordance with instructions may implement the functions associated with reducing a voltage swing in accordance with the present disclosure as described above. If such is the case, it is within the scope of the present disclosure that such instructions may be stored on one or more processor readable media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A method for controlling a semiconductor memory device in order to reduce a voltage swing comprising the steps of:
   applying a plurality of voltage potentials to a memory cell of a plurality of memory cells arranged in arrays of rows and columns, wherein applying the plurality of voltage potentials to the memory cell comprises:
      applying a first voltage potential to a first region of the memory cell via a source line;
      applying a second voltage potential to a second region of the memory cell via a bit line; and
      applying a third voltage potential to a first body region of the memory cell via a first gate coupled to a word line spaced apart from and capacitively coupled to the first body region, wherein the first body region is electrically floating.

2. The method of claim 1, further comprising increasing the first voltage potential applied to the source line from the first voltage potential applied to the source line during a hold operation to perform at least one of a write operation and a read operation.

3. The method of claim 2, wherein the increase between the first voltage potential applied to the source line during the hold operation and the first voltage potential applied to the source line during at least one of the write operation and the read operation is less than 3.5V.

4. The method of claim 2, wherein the increase between the first voltage potential applied to the source line during the hold operation and the first voltage potential applied to the source line during at least one of the write operation and the read operation is less than 2.0V.

5. The method of claim 2, further comprising increasing the second voltage potential applied to the bit line from the second voltage potential applied to the bit line during the hold operation to perform a first phase of the write operation.

6. The method of claim 5, further comprising increasing the third voltage potential applied to the word line from the third voltage potential applied to the word line during the hold operation to perform the first phase of the write operation.

7. The method of claim 6, further comprising decreasing the second voltage potential applied to the bit line from the second voltage potential applied to the bit line during the first phase of the write operation to perform a second phase of the write operation.

8. The method of claim 7, further comprising decreasing the third voltage potential applied to the word line from the third voltage potential applied to the word line during the first phase of the write operation to perform the second phase of the write operation.

9. The method of claim 8, wherein the third voltage potential applied to the word line during the second phase of the write operation decreases before a decrease of the second voltage potential applied to the bit line during the second phase of the write operation.

10. The method of claim 9, wherein the third voltage potential applied to the word line during the second phase of the write operation is equal to the third voltage potential applied to the word line during the hold operation.

11. The method of claim 10, wherein the second voltage potential applied to the bit line during the second phase of the write operation is equal to the second voltage potential applied to the bit line during the hold operation.

12. The method of claim 11, wherein the write operation comprises at least one of a write logic high operation and a write logic low operation.

13. The method of claim 2, further comprising increasing the second voltage potential applied to the bit line from the second voltage potential applied to the bit line during the hold operation to perform the read operation.

14. The method of claim 13, further comprising increasing the third voltage potential applied to the word line from the third voltage potential applied to the word line during the read operation.

15. The method of claim 2, further comprising increasing the third voltage potential applied to the word line from the third voltage potential applied to the word line during the hold operation in order to perform a masking operation during a write logic high operation.

16. The method of claim 2, further comprising increasing the third voltage potential applied to the word line from the third voltage potential applied to the word line during the hold operation in order to perform a masking operation during a write logic low operation.

17. The method of claim 1, further comprising maintaining the first voltage potential applied to the source line from the first voltage potential applied to the source line during a hold operation to perform at least one of a write operation and a read operation.

18. The method of claim 17, further comprising increasing the second voltage potential applied to the bit line from the second voltage potential applied to the bit line during the hold operation to perform at least one of the write operation and the read operation.

19. The method of claim 18, further comprising increasing the third voltage potential applied to the word line from the third voltage potential applied to the word line during the hold operation to perform at least one of the write operation and the read operation.

20. The method of claim 19, wherein the write operation comprises a first phase and a second phase.

21. The method of claim 20, further comprising decreasing the third voltage potential applied to the word line from the third voltage potential applied to the word line during the first phase of the write operation to perform the second phase of the write operation.

* * * * *